United States Patent
Hu et al.

(10) Patent No.: US 12,040,016 B2
(45) Date of Patent: Jul. 16, 2024

(54) CROSSBAR CIRCUITS FOR PERFORMING CONVOLUTION OPERATIONS

(71) Applicant: TetraMem Inc., Fremont, CA (US)

(72) Inventors: Miao Hu, San Jose, CA (US); Wenbo Yin, Alameda, CA (US); Ning Ge, Newark, CA (US)

(73) Assignee: TetraMem Inc., Fremont, CA (US)

(*) Notice: Subject to any disclaimer, the term of this patent is extended or adjusted under 35 U.S.C. 154(b) by 0 days.

(21) Appl. No.: 17/504,478

(22) Filed: Oct. 18, 2021

(65) Prior Publication Data

US 2023/0122160 A1    Apr. 20, 2023

(51) Int. Cl.
  *G11C 13/06*    (2006.01)
  *G11C 13/00*    (2006.01)

(52) U.S. Cl.
  CPC ........ *G11C 13/0069* (2013.01); *G11C 13/004* (2013.01)

(58) Field of Classification Search
  CPC ... G11C 16/0433; G11C 16/08; G11C 16/102; G11C 16/24; G11C 16/26; G11C 13/0002; G11C 13/0004; G11C 13/0007; G11C 13/0021; G11C 13/0023; G11C 13/0026; G11C 13/0028; G11C 13/003; G11C 13/004; G11C 13/0009; G11C 13/0069
  See application file for complete search history.

(56) References Cited

U.S. PATENT DOCUMENTS

| | | | |
|---|---|---|---|
| 9,691,479 B1* | 6/2017 | Merced Grafals | G11C 13/004 |
| 11,397,544 B2* | 7/2022 | Syed | G06N 3/04 |
| 2021/0294874 A1* | 9/2021 | Tang | G11C 11/54 |
| 2022/0101085 A1* | 3/2022 | Garcia Redondo | G11C 11/54 |

OTHER PUBLICATIONS

PCT Search Report for PCT/US2022/078281, dated Nov. 30, 2022, 2 pages.
PCT Written Opinion for PCT/US2022/078281, dated Nov. 30, 2022, 7 pages.

* cited by examiner

*Primary Examiner* — Alfredo Bermudez Lozada
(74) *Attorney, Agent, or Firm* — Jaffery Watson Mendonsa & Hamilton LLP

(57) ABSTRACT

In accordance with some embodiments of the present disclosure, an apparatus for performing convolution operations is provided. The apparatus includes a first crossbar circuit comprising a first plurality of cross-point devices; a second crossbar circuit comprising a second plurality of cross-point devices; and a word line logic to apply input signals to the first crossbar circuit and the second crossbar circuit. The word line logic is configured to provide input signals representative of input data to be convolved using one or more two-dimensional convolution kernels and one or more depth-wise convolution kernels. The first crossbar circuit is configured to output a first plurality of output signals representative of a convolution of the input data and the two-dimensional convolution kernels. The second crossbar circuit is configured to output a second plurality of output signals representative of a convolution of the input data and the depth-wise convolution kernels.

7 Claims, 14 Drawing Sheets

| AddrIO | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | h0w0c0 | h0w0c1 | h0w0c2 | h1w0c0 | h1w0c1 | h1w0c2 | h2w0c0 | h2w0c1 | h2w0c2 | h3w0c0 | h3w0c1 | h3w0c2 | h4w0c0 | h4w0c1 | h4w0c2 | h5w0c0 |
| 1 | h5w0c1 | h5w0c2 | h6w0c0 | h6w0c1 | h6w0c2 | h7... | h7... | h7... | h8... | h8... | h8... | h9... | h9... | h9... | h10... | h10... |
| 2 | ... | | | | | | | | | | | | | | | |
| 3 | h16w0c0 | h16w0c1 | h16w0c2 | h17w0c0 | h17w0c1 | h17w0c2 | h0w1c0 | h0w1c1 | h0w1c2 | h1w1c0 | h1w1c1 | h1w1c2 | h2w1c0 | h2w1c1 | h2w1c2 | h3w1c0 |
| ... | | | | | | | | | | | | | | | | |
| 6 | | | | | | | h0w2c0 | h0w2c1 | h0w2c2 | | | | | | | |
| 7 | h1w2c1 | h1w2c2 | h2w2c0 | h2w2c1 | h2w2c2 | | | | | | | | | | | |

FIG. 7A

CROSSBAR CIRCUITS FOR PERFORMING CONVOLUTION OPERATIONS

TECHNICAL FIELD

The implementations of the disclosure relate generally to crossbar circuits and, more specifically, to crossbar circuits for performing normal 2-D convolution operations and depth-wise convolution operations.

BACKGROUND

A crossbar circuit may refer to a circuit structure with interconnecting electrically conductive lines sandwiching a memory element, such as a resistive switching material, at their intersections. The resistive switching material may include, for example, a memristor (also referred to as resistive random-access memory (RRAM or ReRAM)). Crossbar circuits may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, an apparatus for performing depth-wise convolution operations is provided. The apparatus includes: a plurality of cross-point devices connecting a plurality of word lines and a plurality of bit lines; and a plurality of select lines. The plurality of select lines includes a first select line connecting a first group of the plurality of cross-point devices and a second select line connecting a second group of the plurality of cross-point devices. The first group of the plurality of cross-point devices includes: a first cross-point device connecting a first bit line of the plurality of bit lines and a first word line of the plurality of word lines; and a second cross-point device connecting a second bit line of the plurality of bit lines and a second word line of the plurality of word lines. The second group of the plurality of cross-point devices includes: a third cross-point device connecting the second word line and the first bit line; and a fourth cross-point device connecting a third word line and the second bit line.

In some embodiments, the apparatus further includes a selection logic configured to selectively enable one or more of the plurality of cross-point devices via the plurality of select lines.

In some embodiments, the selection logic is further configured to enable the first plurality of the cross-point devices via the first select line.

In some embodiments, the selection logic is further configured to enable the second plurality of the cross-point devices via the second select line.

In some embodiments, the apparatus further includes a programming logic configured to: map a first plurality of elements of the depth-wise convolution kernels to the first plurality of cross-point devices; and map a second plurality of elements of the depth-wise convolution kernels to the second plurality of cross-point devices.

In some embodiments, the apparatus further includes a word line logic connected to the plurality of word lines, wherein the word line logic is configured to: receive input data to be convolved using a plurality of depth-wise convolution kernels; generate a plurality of input signals representative of the input data; and apply the plurality of input signals to one or more of the plurality of cross-point devices enabled by the selection logic.

In some embodiments, the apparatus further includes a sensing logic to generate digital outputs based on a plurality of output signals outputted via the plurality of bit lines, wherein the digital outputs represent convolutions of the input data and the plurality of depth-wise convolution kernels.

In some embodiments, the first plurality of the cross-point devices further includes a fifth cross-point device connecting the third word line and a third bit line. In some embodiments, the second plurality of the cross-point devices further includes a sixth cross-point device connecting a fourth word line and the third bit line.

In some embodiments, the plurality of select lines is not parallel to the plurality of bit lines.

In some embodiments, the plurality of select lines is not parallel to the plurality of word lines.

In some embodiments, at least one of the plurality of cross-point devices includes a transistor and a memristor.

In some embodiments, the first select line and the second select line are connected to a first selection register.

In some embodiments, the first select line is connected to a first selection register, and wherein the second select line is connected to a second selection register.

According to one or more aspects of the present disclosure, a method for performing depth-wise convolutions using a crossbar-based apparatus is provided. The method includes mapping a plurality of kernels to a plurality of cross-point devices of a crossbar circuit; enabling, via a plurality of select lines of the crossbar circuit, the plurality of cross-point devices; applying, to the plurality of cross-point devices, a plurality of input signals representative of input data to be convolved using the plurality of kernels; and outputting, via a plurality of bit lines of the crossbar circuit, a plurality of output signals representative of convolution results of the input data and the kernels, wherein the plurality of select lines includes a first select line connecting a first group of the cross-point devices and a second group of the cross-point devices. The group of the cross-point devices includes a first cross-point device connecting a first word line and a first bit line and a second cross-point device connecting a second word line and a second bit line. The second group of the cross-point devices includes: a third cross-point device connecting the second word line and the first bit line; and a fourth cross-point device connecting a third word line and the second bit line.

In some embodiments, the plurality of kernels includes a plurality of depth-wise convolution kernels to be used to perform depth-wise convolution operations.

In some embodiments, mapping the plurality of kernels to the plurality of cross-point devices of the crossbar circuit includes: programming a conductance value of the first cross-point device to a first value representative of a first element of a first kernel of the plurality of kernels; and programming a conductance value of the first cross-point device to a second value representative of a first element of a second kernel of the plurality of kernels.

In some embodiments, mapping the plurality of kernels to the plurality of cross-point devices of the crossbar circuit further includes: programming a conductance value of the third cross-point device to a third value representative of a second element of the first kernel; and programming a conductance value of the fourth cross-point device to a fourth value representative of a second element of the second kernel.

In some embodiments, enabling, via the plurality of select lines, the plurality of cross-point devices includes applying a first select voltage to the first select line to enable the first group of the cross-point devices.

In some embodiments, enabling, via the plurality of select lines, the plurality of cross-point devices includes applying a second select voltage to the second select line to enable the second group of the cross-point devices.

In some embodiments, applying, to the plurality of cross-point devices, the plurality of input signals representative of the input data to be convolved using the plurality of kernels includes: applying a first input signal to the first cross-point device via a first word line of the crossbar circuit; and applying a second input signal to the second cross-point device via a second word line of the crossbar circuit, wherein the first input signal represents a first portion of a first channel of the input data, and wherein the second input signal represents a second portion of a second channel of the input data.

In some embodiments, the method further includes: retrieving, from a storage device, a first data item and a second data item stored in consecutive addresses, wherein the first input signal represents the first data item, and wherein the second input signal represents the second data item.

In accordance with some embodiments of the present disclosure, an apparatus for performing normal 2D convolution operations and depth-wise convolution operations is provided. The apparatus includes: a first crossbar circuit includes a first plurality of cross-point devices; a second crossbar circuit includes a second plurality of cross-point devices; and a word line logic connected to the first crossbar circuit and the second crossbar circuit via a plurality of word line. In some embodiments, the word line logic is configured to provide, via the plurality of word lines, a plurality of input signals to the first crossbar circuit and the second crossbar circuit. The input signals may represent input data to be convolved using a plurality of two-dimensional convolution kernels and a plurality of depth-wise convolution kernels.

The apparatus further comprises a first plurality of bit lines connected to the first crossbar circuit and a second plurality of bit lines connected to the second crossbar circuit. The first crossbar circuit is configured to output, via the first plurality of bit lines, a first plurality of output signals representative of convolution results of the input data and the plurality of two-dimensional convolution kernels. The second crossbar circuit is configured to output, via the second plurality of bit lines, a second plurality of output signals representative of convolution results of the input data and the plurality of depth-wise convolution kernels.

In some embodiments, the second plurality of output signals includes a first output signal outputted via a first bit line and a second output signal outputted via a second bit line. The first output signal represents a convolution of a first channel of the input data and a first depth-wise convolution kernel. The second output signal represents a convolution of a second channel of the input data and a second depth wise convolution kernel.

In some embodiments, the apparatus further comprises: a first selection logic configured to selectively enable one or more of the first plurality of cross-point devices of the first crossbar circuit via a first plurality of select lines; and a second selection logic configured to selectively enable one or more of the second plurality of cross-point devices of the second crossbar circuit via a second plurality of select lines.

In some embodiments, the second plurality of select lines includes a first select line connecting a first group of the second plurality of cross-point devices. The first group of the second plurality of cross-point devices includes: a first cross-point device connecting a first bit line of the plurality of bit lines and a first word line of the plurality of word lines; and a second cross-point device connecting a second bit line of the plurality of bit lines and a second word line of the plurality of word lines.

In some embodiments, the second plurality of select lines includes a second select line connecting a second group of the second plurality of cross-point devices. The second group of the second plurality of cross-point devices includes: a third cross-point device connecting a third word line and the first bit line; and a fourth cross-point device connecting a fourth word line and the second bit line.

In some embodiments, the second selection logic includes a selection register connected to the first select line.

In some embodiments, the selection register is further connected to one or more other select lines of the second plurality of select lines.

In some embodiments, the second selection logic is configured to enable the first group of the second plurality of cross-point devices by applying a first select voltage to the first select line.

In some embodiments, the second selection logic is configured to enable the second group of the second plurality of cross-point devices by applying a second select voltage to the second select line.

In some embodiments, the apparatus further includes a programming circuit configured to: program one or more of the first plurality of cross-point devices to store the two-dimensional convolution kernels; and program one or more of the second plurality of cross-point devices to store the plurality of depth-wise convolution kernels.

In some embodiments, the apparatus further includes a sensing logic to generate digital outputs based on the first plurality of output signals and the second plurality of output signals. In some embodiments, at least one of the second plurality of cross-point devices comprise a transistor and a memristor.

In some embodiments, at least one other word line is located between the first word line and the second word line.

In accordance with some embodiments of the present disclosure, a method for performing convolutions is provided. The method includes: providing, via a word line logic of a crossbar-based apparatus, a plurality of input signals to a first crossbar circuit and a second crossbar circuit of the crossbar-based apparatus, wherein the plurality of input signals represents input data to be convolved using a plurality of two-dimensional convolution kernels and a plurality of depth-wise convolution kernels; outputting, using the first crossbar circuit, a first plurality of output signals representative of convolution results of the input data and the plurality of two-dimensional convolution kernels; and outputting, using the second crossbar circuit, a second plurality of output signals representative of convolution results of the input data and the plurality of depth-wise convolution kernels.

In some embodiments, the method for performing convolutions further includes: programming a first plurality of cross-point devices of the first crossbar circuit to store the plurality of two-dimensional kernels.

In some embodiments, the method for performing convolutions further includes: enabling the first plurality of cross-point devices of the first crossbar circuit via a first plurality of select lines of the crossbar-based apparatus; and outputting the first plurality of output signals via a first plurality of bit lines of the crossbar-based apparatus.

In some embodiments, the method for performing convolutions further includes: programming a second plurality of cross-point devices of the second crossbar circuit to store the plurality of depth-wise convolution kernels.

In some embodiments, the method for performing convolutions further includes: enabling the second plurality of cross-point devices of the second crossbar circuit via a second plurality of select lines of the crossbar-based apparatus; and outputting the second plurality of output signals via a second plurality of bit lines of the crossbar-based apparatus.

In some embodiments, programming the second plurality of cross-point devices of the second crossbar circuit to store the plurality of depth-wise convolution kernels includes: programming a first cross-point device to store a first element of a first kernel, wherein the first cross-point device connects a first bit line and a first word line; and programming a second cross-point device to store a first element of a second kernel, wherein the second cross-point device connects a second bit line and a second word line In some embodiments, enabling the second plurality of cross-point devices includes enabling the first cross-point device and the second cross-point devices via a first select line of the second plurality of select lines.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

FIGS. 7A and 7B are diagrams illustrating an example data structure that may be used to store image data in accordance with some embodiments of the present disclosure.

DETAILED DESCRIPTION

Aspects of the disclosure provide crossbar-based apparatuses and crossbar circuits for performing convolution operations and methods for performing the convolution operations using the crossbar-based apparatuses and the crossbar circuits.

Crossbar circuits may be used to implement a neural network executing machine learning algorithms. The neural network may include multiple convolutional layers performing various types of convolution operations, such as 2D convolution operations, depth-wise convolution operations, etc. A 2D convolution may be performed by applying a single convolution kernel to input data. More particularly, the convolution kernel may be used to scan each part of the input data with the same size as the convolution kernel to produce a convolution result. The convolution kernel and the input data have the same number of channels. For example, performing a 2D convolution on an image of three channels using a 3×3×3 kernel may involve performing scalar matrix multiplication on portions of the image having a size of 3×3×3 using the 3×3×3 kernel. As another example, performing a depth-wise convolution on the image may involve convolving each channel of the image with a respective kernel and stacking the convolved outputs together. As a more particular example, performing depth-wise convolution on the image may involve convolving each channel of the examples using a 3×3 kernel.

Figure 7B:
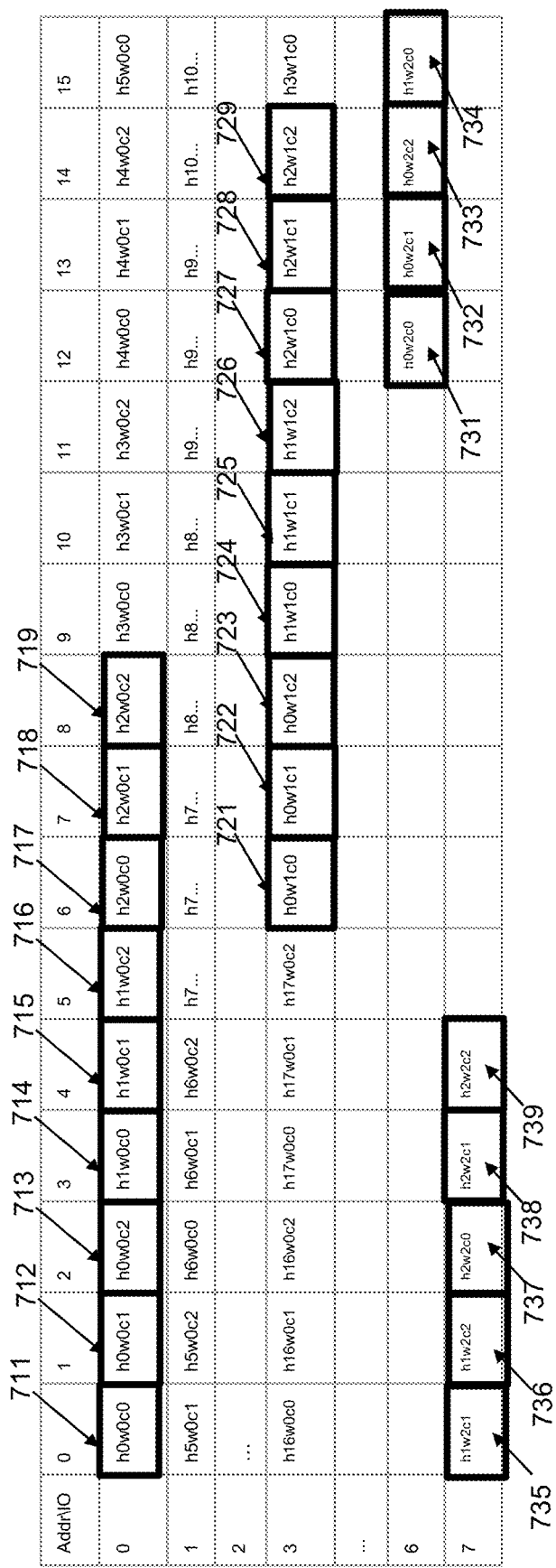

The image may be stored in memory as a three-dimensional array. For example, each element of the image may be represented by a three-dimensional array, where the last dimension represents the channel dimension (e.g., an array of a height value (h), a width value (w), and a channel value (c)). The first element of the first channel of the image, the first element of the second channel of the image, and the first element of the third channel of the image may be represented as (h0, w0, c0), (h0, w0, c1), and (h0, w0, c2), respectively. The second element of the first channel of the image, the second element of the second channel of the image, and the second element of the third channel of the image may be represented as (h1, w0, c0), (h1, w0, c1), and (h1, w0, c2), respectively. The elements (h0, w0, c0), (h0, w0, c1), (h0, w0, c2), (h1, w0, c0), (h1, w0, c1), and (h1, w0, c2) may be stored in continuous addresses of the memory. For example, the image may be stored in the memory utilizing a data structure as shown in FIGS. 7A and 7B.

As described above, performing 2D convolution and depth-wise convolution on the same image involve convolving different portions of the image using different kernels. For example, to convolve a 3×3×3 portion of the image using a 3×3×3 2D convolution kernel, a conventional crossbar circuit may retrieve data items stored in addresses 710, 720, and 730 as shown in FIG. 7A. As another example, to perform depth-wise convolution on the 3×3×3 portion of the image, the conventional crossbar circuit may convolve data items stored in addresses 711, 714, 717, 721, 724, 727, 731, 743, and 737 with a first 3×3 kernel. The conventional crossbar circuit may convolve data items stored in addresses 712, 715, 718, 722, 725, 728, 732, 735, and 738 with a second 3×3 kernel. The conventional crossbar circuit may further convolve data items stored in addresses 713, 716, 719, 723, 726, 729, 733, 736, and 739 with a third 3×3 kernel. As such, to perform 2D convolution and depth-wise convolution on the same image, the conventional crossbar circuit may have to retrieve the image data from the memory utilizing different memory access patterns, resulting in low memory access efficiency and high-power consumption.

The present disclosure provides crossbar-based apparatuses that may perform both 2D convolution and depth-wise convolution that enables efficient memory access during 2D convolution operations and depth-wise convolution operations.

In some embodiments, a crossbar-based apparatus may include a first crossbar circuit for performing 2D convolution and a second crossbar circuit for performing depth-wise convolution. Each of the first crossbar circuit and the second crossbar circuit may include cross-point devices connecting intersecting word lines and bit lines.

The first crossbar circuit may be connected to a first selection logic via a first plurality of select lines. Each of the first plurality of select lines may connect multiple cross-point devices of the first crossbar circuit. The first election logic may selectively enable cross-point devices connected to one or more of the first plurality of selection lines.

The second crossbar circuit may be connected to the second selection logic via a second plurality of select lines. Each of the second plurality of select lines may connect multiple cross-point devices of the second crossbar circuit that are not connected to the same word line or bit line. The second election logic may selectively enable cross-point devices connected to one or more of the second plurality of selection lines.

The first crossbar circuit and the second crossbar circuit may be connected to a word line (WL) logic via the word lines. The WL logic may retrieve image data stored in continuous addresses of a storage device associated with the crossbar-based apparatus (e.g., an input buffer). The WL logic may further generate input signals (e.g., voltage signals) based on the retrieved image data and apply the input signals to the first crossbar circuit and the second crossbar circuit via the word lines.

The first crossbar circuit may be programmed to store 2D convolution kernels for performing 2D convolution operations. For example, the cross-point devices of the first crossbar circuit may be programmed to conductance values representative of the 2D convolution kernels. In response to the input signals, the first crossbar circuit may output current signals representative of convolution results of the image and the 2D convolution kernels.

The second crossbar circuit may be programmed to store depth-wise convolution kernels for performing depth-wise convolution operations. For example, the cross-point devices of the second crossbar circuit may be programmed to conductance values representative of the depth-wise convolution kernels. In response to the input signals, the second crossbar circuit may output current signals representative of convolution results of the depth-wise kernels. Accordingly, the crossbar-based apparatus may perform both 2-D convolution and depth-wise convolution utilizing the same memory access patterns, which may enable efficient memory usage of a neural network incorporating the crossbar-based apparatus.

Figure 1:
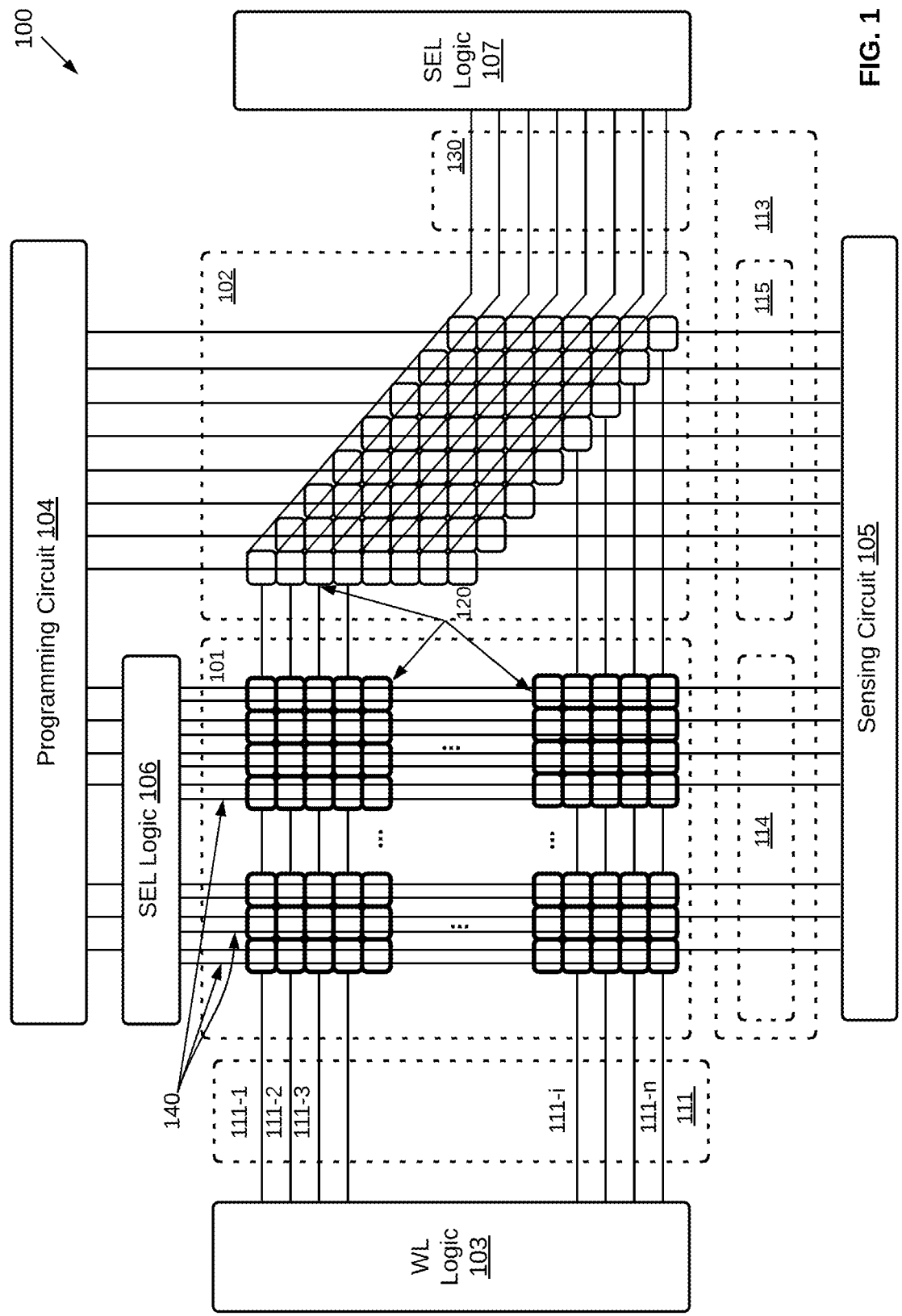
FIG. 1 is a schematic diagram illustrating an example of a crossbar-based apparatus in accordance with some implementations of the disclosure.

FIG. 1 is a schematic diagram illustrating an example 100 of an apparatus for performing convolution operations in accordance with some embodiments of the present disclosure. The apparatus 100 may also be referred to herein as a crossbar-based apparatus. The apparatus 100 may be a neural processing unit (NPU) or a part of an NPU for executing machine learning algorithms.

As shown, apparatus 100 may include a first crossbar circuit 101 and a second crossbar circuit 102 for performing convolution operations. Each of the first crossbar circuit 101 and the second crossbar circuit 102 may include one or more crossbar arrays. Each of the crossbar arrays may include a plurality of intersecting wires, such as one or more word lines (WL) 111, bit lines (BL) 113, etc. The crossbar array may further include one or more cross-point devices 120 connecting one or more intersections between the word lines and the bit lines. A cross-point device connecting the jth word line and the kth bit line may be referred to as the cross-point device 120(j, k). Each of the cross-point devices may be a device with programmable resistance, such as a memristor, phase-change memory (PCM) devices, floating gate devices, spintronic devices, resistive random-access memory (RRAM), static random-access memory (SRAM), etc. In some embodiments, the cross-point device 120 may be and/or include a circuit structure of one-transistor-one-memristor (1T1M), a one-selector-one-resistor (1S1R) structure, a two-resistor (2R) structure, etc. In some embodiments, one or more cross-point devices 120 may include a cross-point device 200 as described in connection with FIG. 2.

As illustrated in FIG. 1, the first crossbar circuit 101 and the second crossbar circuit may be connected to a word line (WL) logic 103 via the word lines 111 (e.g., WL 111-1, 111-2, 111-3, 111-4, etc.) and may be connected to a programming circuit 104 and a sensing circuit 105 via the bit lines 113. The WL logic 103 may include any suitable component for converting input data into input signals to be applied to the crossbar circuit 101 and/or the crossbar circuit 102. Each of the input signals may be a voltage signal, a current signal, etc. In some embodiments, the WL logic 103 may one or more digital-to-analog converters (DACs) that may convert the input data into analog signals.

The programming circuit 104 may program the cross-point devices 120 to suitable conductance values. For example, programming a cross-point device may involve applying a suitable voltage signal or current signal across the cross-point device. The resistance of each cross-point device may be electrically switched between a high-resistance state and a low-resistance state. Setting a cross-point device may involve switching the resistance of the cross-point from the high-resistance state to the low-resistance state. Resetting the cross-point device may involve switching the resistance of the cross-point from the low-resistance state to the high-resistance state.

The first crossbar circuit 101 may be connected to a first selection logic 106 via select lines 140. The second crossbar circuit 102 may be connected to a second selection logic 107 via select lines 130. The Each of the select lines 130 and 140 may include any suitable electrically conductive material. In some embodiments, each select line 130 and 140 may be and/or include a metal wire. While a suitable voltage (also referred to herein as a select voltage) is applied to a given select line 130, the cross-point devices connected to the select line 130 may be enabled. The first selection logic 106 may selectively enable one or more cross-point devices of the first crossbar circuit 101 via one or more select lines 140 (e.g., by applying a select voltage on the one or more select lines 140). The second selection logic 107 may selectively enable one or more cross-point devices of the second crossbar circuit 102 via one or more select lines 130 (e.g., by applying a select voltage on the one or more select lines 130).

The sensing circuit 105 may generate output signals based on the current following through bit lines 113. In some embodiments, the sensing circuit 105 may include any suitable component for converting the current into a digital output. For example, the sensing circuit 105 may include multiple analog-digital converters (ADCs) (not shown). Each of the ADCs may convert the current flowing through a respective bit line into a digital output. In some embodiments, the input signal may include a voltage signal V. The output signal may include a current signal I. The relationship between the input signal and the output signal may be represented as I=VG, wherein G represents the conductance values of the cross-point devices 120. As such, the input signal is weighted at each of the cross-point devices by its conductance according to Ohm's law. The weighted current is outputted via each bit line and may be accumulated according to Kirchhoff's current law.

Each of the crossbar circuits 101 and 102 may be configured to perform vector-matrix multiplication (VMM). A VMM operation may be represented as Y=XA, wherein each of Y, X, A represents a respective matrix. More particularly, for example, input vector X may be mapped to the input voltage V of the crossbar circuits 101 and/or 102. Matrix A may be mapped to conductance values G. The output current I may be read and mapped back to output results Y.

In some embodiments, the first crossbar circuit 101 and the second crossbar circuit 102 may perform different types of convolution operations. For example, the first crossbar circuit 101 may perform 2D convolution operations. The second crossbar circuit 102 may perform depth-wise convolutions.

Performing 2D convolution on input data may involve applying a single convolution kernel to the input data. The convolution kernel may have a particular size defined by multiple dimensions (e.g., a width, a height, a channel, etc.). The convolution kernel may be applied to a portion of the input data having the same size as the convolution kernel to produce an output. The output may be mapped to an element of the convolution result that is located at a position corresponding to the position of the portion of the input data.

Figure 6A:
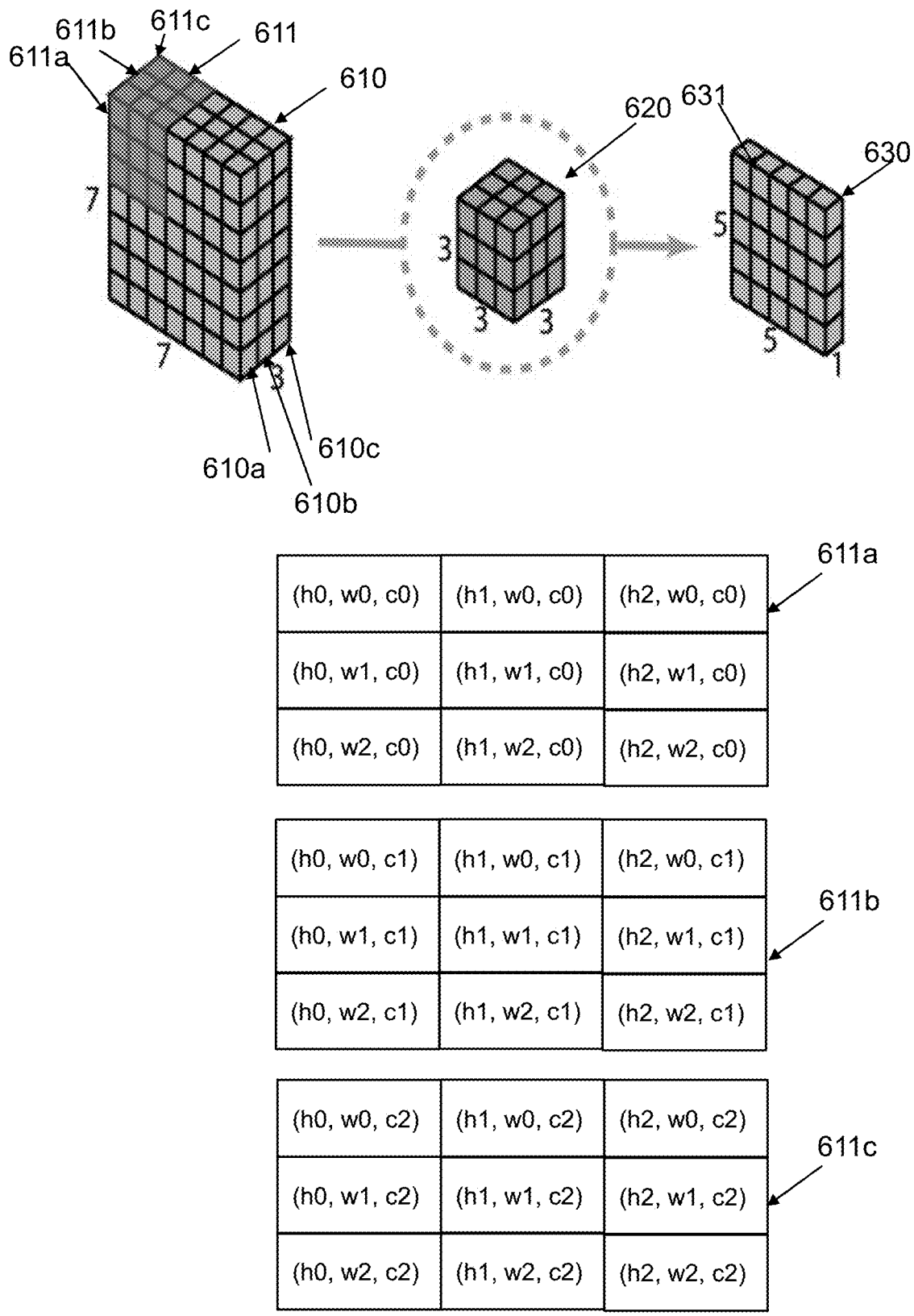
FIGS. 6A and 6B are diagrams illustrating example convolution operations.

For example, as shown in FIG. 6A, a kernel 620 may be used to perform 2D convolution on an image 610 to produce an output image 630. The image 610 may include a first channel 610a, a second channel 610b, and a third channel 610c. The size of the image 610 may be defined by its width (w), height (h), and channels (c). As an example, the size of the image 610 may be 7×7×3. The size of the kernel 620 may be 3×3×3. The kernel 620 may be applied to a first portion 611 of the image 610. As shown, the size of the first portion 611 is the same size as that of the kernel 620. A scalar multiplication of the first portion 610 by the kernel 620 may be performed to obtain the first element 631 of the output image. The kernel 620 may be used to scan each of a plurality of 3×3×3-sized portions of the image 610 to produce an element of the output image 630. In some embodiments, the kernel 620 may be applied to 5×5×1 such portions in the image 610 to produce the 5×5×1 output image 630.

An element of the image 610 may be defined by a three-dimensional array of a height value, a width value, and a channel value. For example, as shown in FIG. 6A, a first portion 611 of the image 610 may be regarded as an image of three channels 611a, 611b, and 611c. Each of the image 611a, 611b, and 611c may include nine elements defined by various width (w) values, height (h) values, and channel (c) values as shown in FIG. 6A. The image 610 may be stored in a storage device as three-dimensional arrays utilizing a data structure illustrated in FIGS. 7A-7B.

Performing a depth-wise convolution on the input data may involve convolving each channel of the input data with a respective kernel corresponding to the channel and stacking the convolved outputs together. For example, performing depth-wise convolution on the image 610 may involve convolving each channel of the image 610 using kernels 621, 623, and 625, respectively. Each of the kernels 621, 623, and 625 may correspond to a channel of the kernel 620 of FIG. 6A. Convolving the image 611a with the kernel 621 may involve performing element-wise multiplication between an element of the image 611a and an element of the kernel 621 that are located at the same position. Convolving the first channel 611a of the image 610 using the kernel 621 may produce an output 641. Convolving the second channel 611b of the image 610 using the kernel 623 may produce an output 643. Convolving the third channel 611c of the image 610 using the kernel 625 may produce an output 645. The outputs 641, 643, and 645 may be stacked together as an output 640. A pointwise convolution may then be performed on the output 640 using an 1×1×3 kernel 650 to produce the output image 630.

Referring back to FIG. 1, the WL logic 103 may retrieve, from a storage device associated with the apparatus 100, input data to be processed by the crossbar circuits 101 and/or 102. The storage device may be an input buffer in some embodiments. The WL logic 103 may convert the input data into vectors and may further generate input signals representing the vectors. The input signals may be applied to crossbar circuits 101 and/or 102 via one or more word lines 111.

Figure 6B:
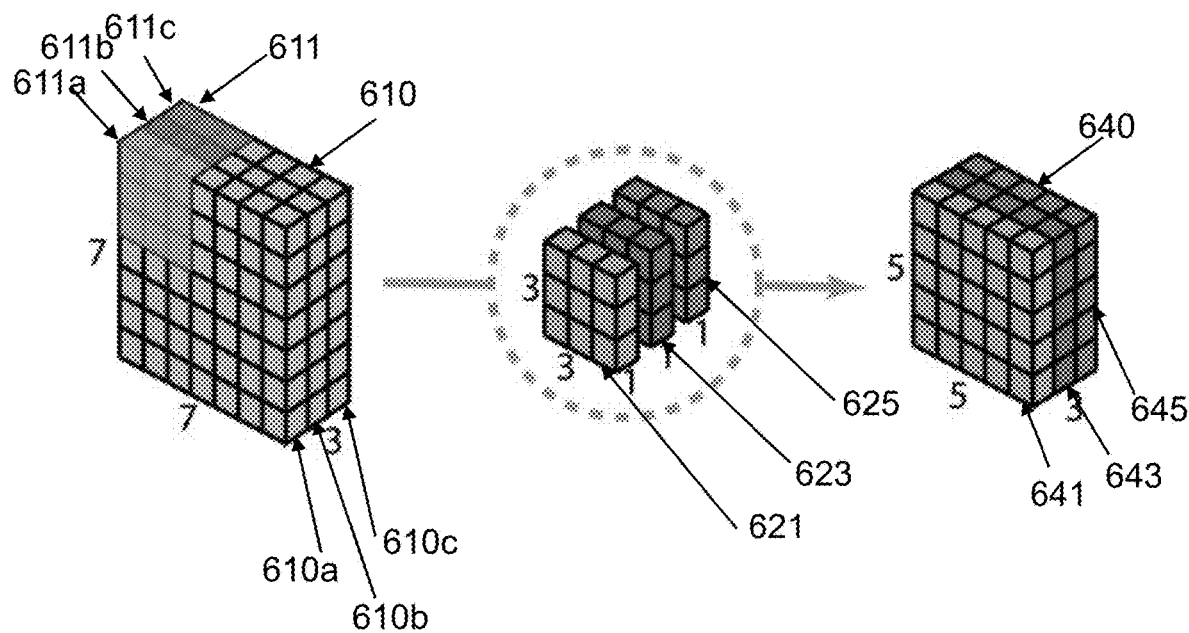
Figure 6B:
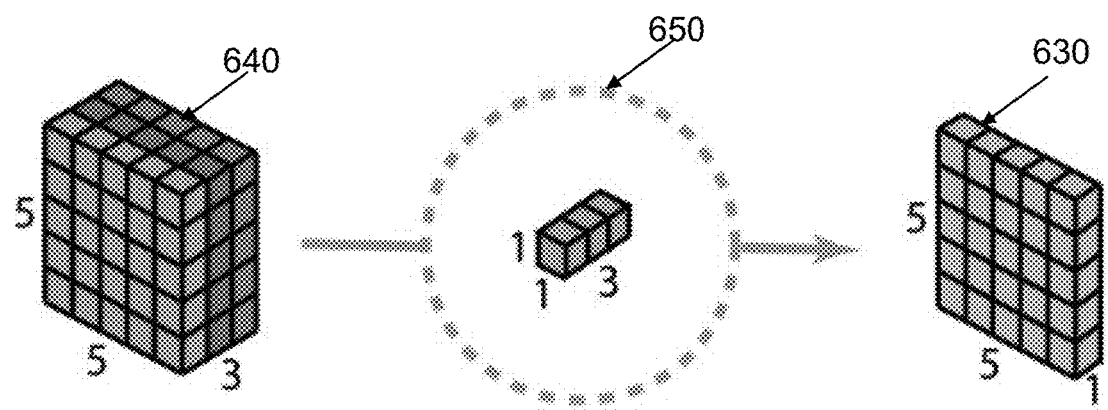

In some embodiments, the input signals applied to the first crossbar circuit and the second crossbar circuit via 111-1, 111-2, 111-3, . . . , 111-n may correspond to data stored in continuous addresses of the storage device. For example, to perform convolutions on the image 611 of FIGS. 6A-6B, the WL logic 103 may retrieve image data of the image 611 stored in addresses 710, 720, and/or 730 of the storage device as shown in FIG. 7A.

More particularly, for example, a first data item stored in a first address 711 of the storage device may be applied to the first crossbar circuit and the second crossbar circuit via the word line 111a. A second data item stored in a second address 712 of the storage device may correspond to a second input signal applied to the first crossbar circuit and the second crossbar circuit via the word line 111b. A third data item stored in a second address 713 of the storage device may correspond to a third input signal applied to the first crossbar circuit and the second crossbar circuit via the word line 111c. An ith data item stored in the ith address of the storage device may be applied to the first crossbar circuit and the second crossbar circuit via 111i. The first address, the second address, . . . , the ith address, etc. may be continuous.

The programming circuit 104 may program the first crossbar circuit 101 to store 2D convolution kernels for performing 2D convolution operations. For example, a 2D convolution kernel may be converted into a vector and mapped to a plurality of cross-point devices of the first crossbar circuit that are connected to a given bit line. In particular, the conductance values of the cross-point devices may be programmed to values representative of the 2D convolution kernel. In response to the input signals 111, the first crossbar circuit 101 may output, via the given bit line, a current signal representative of a convolution of the image and the 2D convolution kernel. In some embodiments, the first crossbar circuit 101 may store multiple 2D convolution kernels by mapping each of the 2D convolution kernels to the cross-point devices connected to a respective bit line. The first crossbar circuit 101 may output a plurality of output signals (e.g., current signals) representative of the convolution results via a first plurality of bit lines 113a.

The programming circuit 104 may program the second crossbar circuit 102 may be programmed to store depth-wise convolution kernels for performing depth-wise convolution operations. For example, the cross-point devices of the second crossbar circuit may be programmed to conductance values representative of the depth-wise convolution kernels. In response to the input signals 111, the second crossbar circuit may output current signals representative of convolution results of the depth-wise convolution operations via a second plurality of bit lines 113*b*. In some embodiments, the crossbar circuit 102 may include one or more crossbar circuit as described in connection with FIGS. 3-4D.

Figure 2:
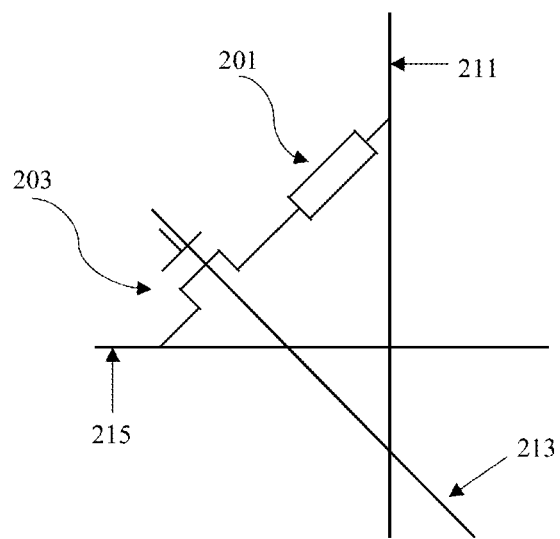
FIG. 2 is a schematic diagram illustrating an example of a cross-point device in accordance with some implementations of the disclosure.

FIG. 2 is a schematic diagram illustrating an example 200 of a cross-point device in accordance with some embodiments of the present disclosure. As shown, cross-point device 200 may be connected to a bit line (BL) 211, a select line (SEL) 213, and a word line (WL) 215. The bit line 211, the select line 213, and the word line 215 may be a bit line 113, a select line 130 or 140, and a word line 111 as described in connection with FIG. 1, respectively.

Cross-point device 200 may include an RRAM device 201 and a transistor 203. A transistor is a three-terminal device, which may be marked as gate (G), source (S), and drain (D), respectively. The transistor 203 may be serially connected to RRAM device 201. As shown in FIG. 2, the first electrode of the RRAM device 201 may be connected to the drain of transistor 203. The second electrode of the RRAM device 201 may be connected to the bit line 211. The source of the transistor 203 may be connected to the word line 215. The gate of the transistor 203 may be connected to the select line 213. RRAM device 201 may include one or more RRAM devices as described in connection with FIGS. 3A-5B below. Cross-point device 200 may also be referred to as in a 1-transistor-1-resistor (1T1R) configuration. The transistor 203 may perform as a selector as well as a current controller, which may set the current compliance to the RRAM device 201 during programming. The gate voltage on transistor 203 can set current compliances to cross-point device 200 during programming and can thus control the conductance and analog behavior of cross-point device 200. For example, when cross-point device 200 is set from a high-resistance state to a low-resistance state, a set signal (e.g., a voltage signal, a current signal) may be provided via the bit line (BL) 211. Another voltage, also referred as a select voltage or gate voltage, may be applied via the select line (SEL) 213 to the transistor gate to open the gate and set the current compliance, while the word line (WL) 215 may be set to ground. When cross-point device 200 is reset from the low-resistance state to the high-resistance state, a gate voltage may be applied to the gate of the transistor 203 via the select line 213 to open the transistor gate. Meanwhile, a reset signal may be sent to the RRAM device 201 via the word line 215, while the bit line 211 may be set to ground.

Figure 3:
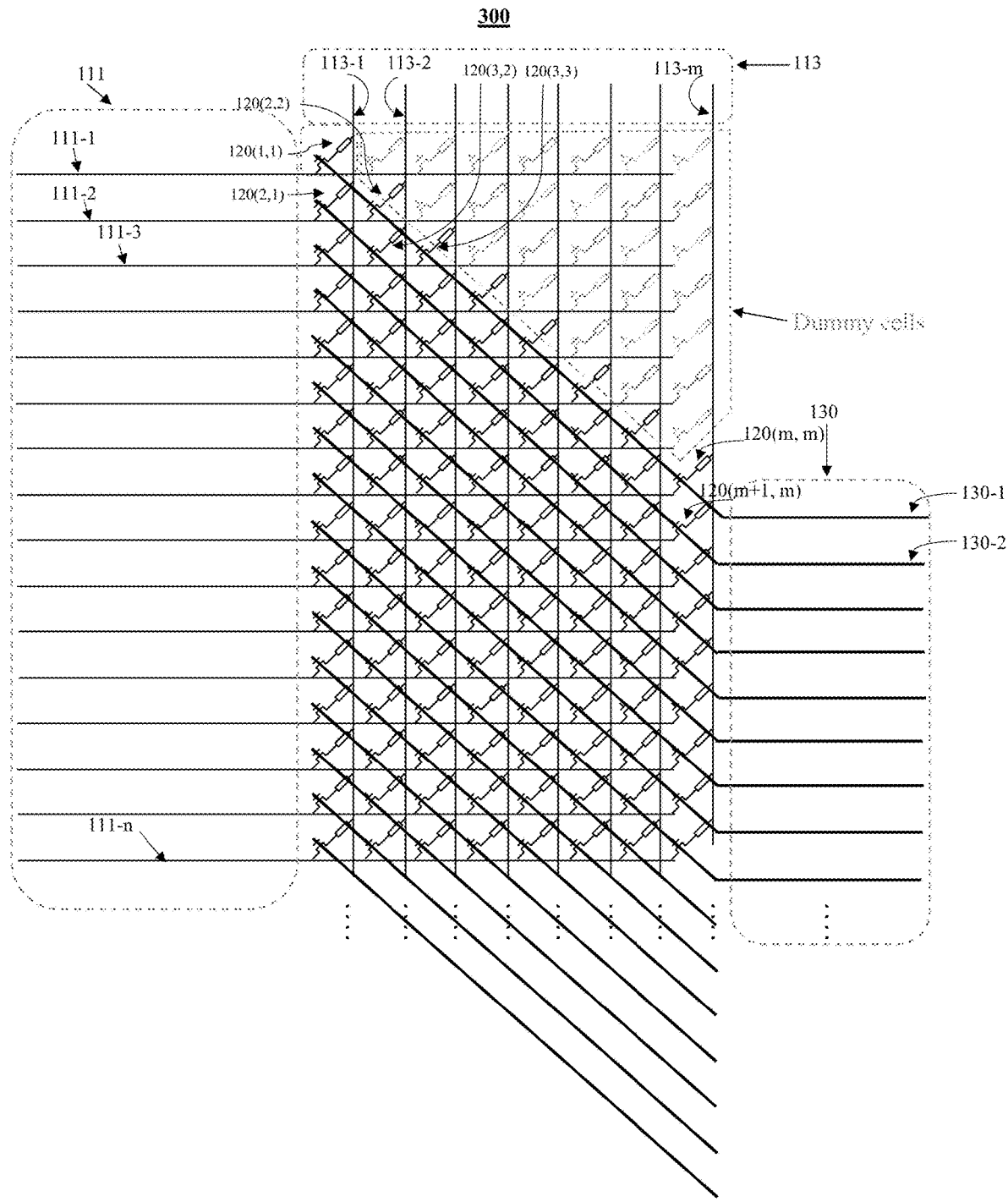
FIG. 3 depicts an example of a crossbar circuit in accordance with some implementations of the disclosure.

FIG. 3 is a diagram illustrating an example 300 of a crossbar circuit that may perform depth-wise convolution operations. The crossbar circuit 300 may be the crossbar circuit 103 as described in connection with FIG. 1.

As shown, crossbar circuit 300 may include word lines 111, bit lines 113, cross-point devices 120, and select lines 130 (e.g., select lines 130-1, 130-2, etc.). In some embodiments, the number of the select lines may be n−m+1, where n and m refer to the number of the word lines 111, and the number of the bit lines 113, respectively.

In some embodiments, each select line 130 may electrically connect a plurality of cross-point devices that neither share a bit line nor a word line (e.g., cross-point devices located at different rows and different columns). A select line 130 is not parallel to the bit lines 113 or the word lines 111 in some embodiments. For example, a select line 130-1 may connect a first cross-point device 120(1, 1), a second cross-point device 120(2, 2), a third cross-point device 120(3, 3), etc. The first cross-point device 120(1, 1) may connect a first word line 111-1 and a first bit line 113-1. The second cross-point device 120(2, 2) may connect a second word line 111-2 and a second bit line 113-2. The third cross-point device 120(3, 3) may connect a third word line 111-3 and a third bit line 113-3. As such, the first cross-point device, the second cross-point device, and the third cross-point device are not connected to the same word line or the same bit line. As another example, the select line 130-2 may connect cross-point devices 120(2, 1), 120(3, 2), . . . , **120((*m*+1), m)**.

While a suitable voltage is applied to a given select line 130, the cross-point devices connected to the select line 130 may be enabled. The cross-point devices that may be enabled by one or more of the select lines 130 are also referred to herein as the "effective cells." The cross-point devices that cannot be enabled by the select lines 130 are also referred to herein as the "dummy cells." The dummy cells do not function when the crossbar-circuit 300 is performing a depth-wise convolution operation. In one implementation, the dummy cells are not connected to a select line. In another implementation, the dummy cells are connected to one or more select lines (not shown) but are not enabled during a convolution operation. In a further implementation, the crossbar circuit 300 does not include the dummy cells. As shown, the effective cells may form a parallelogram shape in some embodiments.

To perform depth-wise convolution operations on input data (e.g., one or more images), the crossbar circuit 300 may calculate matrix multiplications of one or more matrices corresponding to the input data and one or more matrices corresponding to a depth-wise convolution kernel. The input data may have multiple channels. The depth-wise convolution kernel may be divided into multiple two-dimensional kernels. Each of the two-dimensional kernels may be used to convolve a respective channel of the input data. An element of a kernel may be mapped to a cross-point device of the crossbar circuit 300 by programming the conductance of the cross-point device to a value corresponding to the value of the element of the kernel. The cross-point devices may be programmed to store depth-wise convolution kernels utilizing one or more mapping schemes described in connection with FIGS. 4A-4E below.

As an example, convolving the first channel of the input data using a kernel may involve calculating a matrix multiplication of a first matrix representing the first channel of the first image and a second matrix representing the kernel. The crossbar circuit 300 may program the cross-point devices so that the conductance values of the cross-point devices may represent values of the elements of the kernel (e.g., by programming the cross-point devices using programming signals corresponding to the conductance values). The first matrix may be converted into a plurality of vectors that represent portions of the first matrix. The crossbar circuit 300 may receive a plurality of input signals representative of the vectors. When the input signals are applied to the crossbar circuit 300 via the word lines, by Ohm's law, the current passing each cross-point device is a multiplication of its conductance and the corresponding voltage applied to the word line connected to the cross-point device. By Kirckhoff's currently law, currents from each cross-point device connected to the same bit line are accumulated. The output current from each bit line represents a multiply-accumulate operation result and a convolution of the first channel of the input data and the kernel.

The crossbar circuit 300 may perform multiple depth-wise convolution operations in parallel utilizing the kernel mapping schemes described in connection with FIGS. 4A-4E below.

Figure 4A:
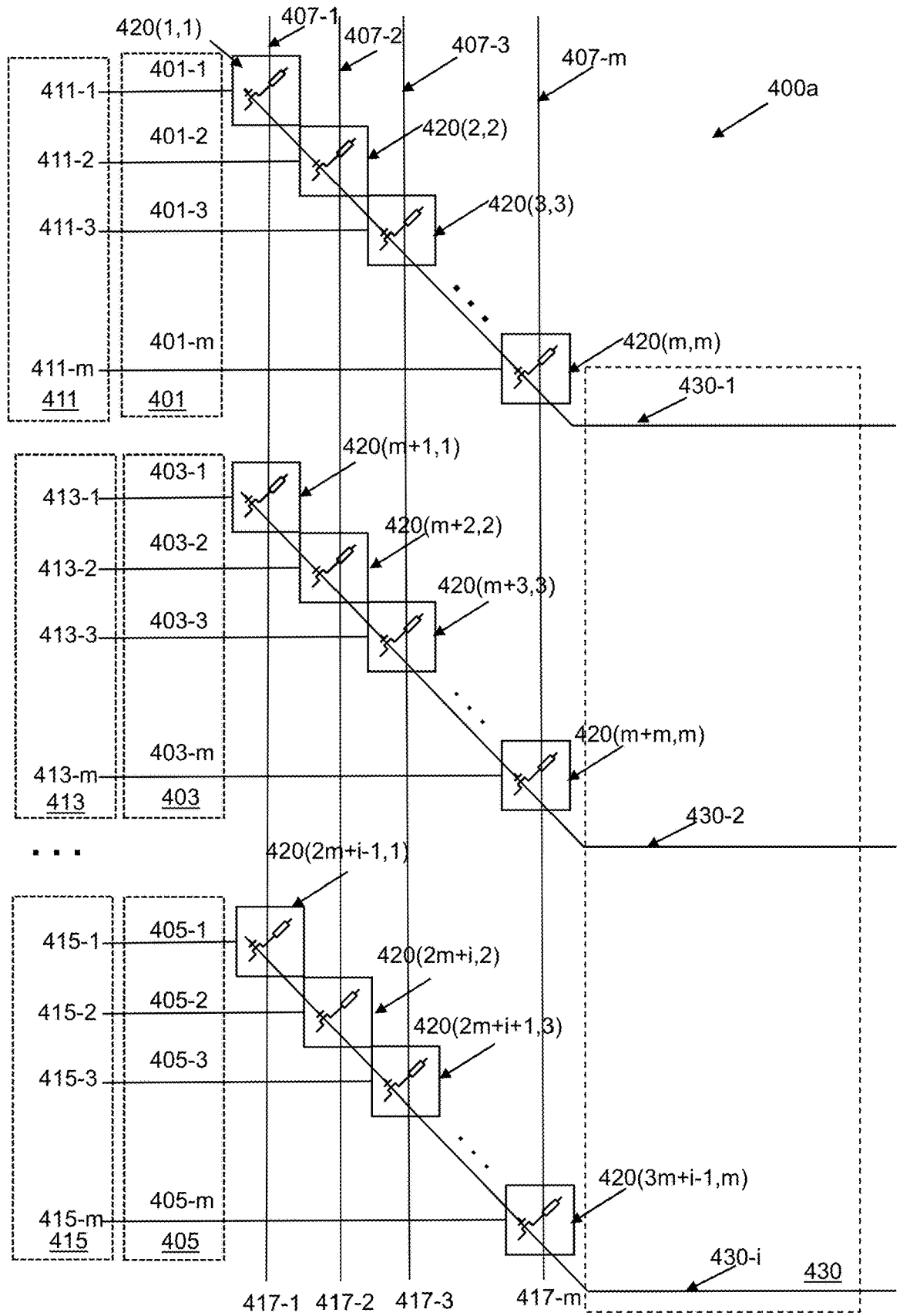
FIGS. 4A, 4B, 4C, 4D, and 4E illustrate examples of crossbar circuits and mapping schemes for performing depth-wise convolution operations in accordance with some embodiments of the present disclosure.

FIG. 4A illustrates an example 400a of a crossbar circuit for performing depth-wise convolution operations in accordance with some embodiments of the present disclosure. The crossbar circuit 400a may be and/or include the crossbar circuit 300 as described in connection with FIG. 3.

As shown, the crossbar circuit 400a may include a plurality of cross-point devices 420 (e.g., 420(1, 1), 420(2, 2), etc.) connecting a plurality of word lines (e.g., word lines 401, 403, 405) and a plurality of bit lines (bit lines 407-1, 407-2, 407-3, . . . , 407-m). A cross-point device 420(j, k) may refer to the cross-point device that connects the jth word line and the kth bit line. The crossbar circuit 400a may further include select lines for selectively enabling one or more of the cross-point devices 420. For example, a first select line 430-1 may connect a first group of cross-point devices of the crossbar circuit 400a (e.g., cross-point devices 420(1, 1), 420(2, 2), 420(3, 3), . . . , 420(m, m). A second select line 430-2 may connect a second group of cross-point devices of the crossbar circuit 400a (e.g., cross-point devices 420(m+1, 1), 420(m+2, 2), 420(m+3, 3), . . . , 420(m+m, m). The ith select line 430-i may thus connect the ith group of cross-point devices of the crossbar circuit 400a (e.g., cross-point devices 420(2m+i−1, 1), 420(2m+i, 2), 420(2m+i+1, 3), . . . , 420(3m+i−1, m). The cross-point devices, the word lines, the bit lines, and the select lines as shown in FIG. 4A may be the same as their counterparts in FIGS. 1-3.

The crossbar circuit 400a may store multiple kernels to perform depth-wise convolution operations in parallel. Each of the kernels may be used to convolve a portion of a respective channel of the input data. The elements of the kernels that are located at the same position (e.g., a position defined by the same width and the same height) may be mapped to cross-point devices connected to the same select line. The elements of a given kernel may be mapped to a plurality of cross-point devices connected to the same bit line. For example, the first element of each kernel may be mapped to a cross-point device connected to a first select line. More particularly, for example, a first element of a first kernel, a first element of a second kernel, a first element of a third kernel, . . . , and a first element of the mth kernel may be mapped to the cross-point devices 420(1, 1), 420(2, 2), 420(3, 3), . . . , and 420(m, m), respectively. As another example, the second element of each kernel may be mapped to a cross-point device connected to the second select line 430-2. More particularly, for example, a second element of the first kernel, a second element of the second kernel, a second element of the third kernel, . . . and a second element of the mth kernel may be mapped to cross-point devices 420(m+1, 1), 420(m+2, 2), 420(m+3, 3), . . . , 420(m+m, m), respectively. As another example, the ith element of each kernel may be mapped to a cross-point device connected to the ith select line 430-i (e.g., cross-point devices 420(2m+i−1, 1), 420(2m+i, 2), 420(2m+i+1, 3), . . . , 420(3m+i−1, m)).

In one implementation, the word lines 401-m and 403-1 are adjacent to each other. For example, the select lines 430-1 and 430-2 may correspond to select lines 434-1 and 434-2 of FIG. 4C, respectively. In another implementation, the word lines 401-m and 403-1 are not adjacent to each other. One or more other word lines (not shown) are positioned between the word lines 401-m and 403-1. For example, the select lines 430-1 and 430-2 may correspond to select lines 431-1 and 432-1 of FIG. 4B, respectively. Similarly, the word lines 403-m and 405-1 may or may not be adjacent to each other.

The crossbar circuit may perform m depth-wise convolution operations in parallel. Each of the depth-wise convolution operations may produce a convolution of a portion of the input data and a kernel having i elements. For example, the first select line, the second select line, . . . , and the ith select line may be selected (e.g., by applying a suitable voltage to each of the select lines). The cross-point devices connected to the first select line, the second select line, . . . , and the ith select line may thus be enabled. Input signals representative of input data to be convolved may be applied to the enabled cross-point devices via the word lines connected to the enabled cross-point devices. For example, input signals 411-1, 411-2, 411-3, . . . , 411-m may be applied to the first group of cross-point devices via word lines 401-1, 401-2, 401-3, . . . , 401-m, respectively. Input signals 413-1, 413-2, 413-3, . . . , 413-m may be applied to the second group of cross-point devices via word lines 403-1, 403-2, 403-3, . . . , 403-m, respectively. Input signals 415-1, 415-2, 415-3, . . . , 415-m may be applied to the third group of cross-point devices via word lines 405-1, 405-2, 405-3, . . . , 405-m, respectively. Input signals 411-1, 411-2, . . . , 411-m may correspond to a portion of the input data corresponding to a first width value (e.g., w0). Input signals 413-1, 413-2, . . . , 413-m may correspond to a second portion of the input data corresponding to a second width value (e.g., w1). Input signals 415-1, 415-2, . . . , 415-m may correspond to a third portion of the input data corresponding to a third width value (e.g., w2). Input signals 411-1, 413-1, 415-1 may correspond to a first channel of the input data (e.g., c0). Input signals 411-2, 413-2, 415-2 may correspond to a second channel of the input data (e.g., c1). Input signals 411-3, 413-3, 415-3 may correspond to a third channel of the input data (e.g., c2). As an example, the input signals 411, 413, and 415 may represent the data items stored in addresses 710, 720, and 730 of FIG. 7, respectively. More particularly, for example, input signals 411-1, 411-2, . . . , 411-m may represent the data items stored in continuous addresses 711, 713, . . . , 719 of the storage device.

The cumulative current outputted via a bit line 417 (e.g., bit lines 417-1, 417-2, 417-3, . . . , and 417-m) may represent a convolution of the channel of the input data and the kernel mapped to the cross-point device connected to the bit line. For example, a first output signal, a second output signal, a third output signal, . . . , and the mth output signal may be outputted via bit lines 417-1, 417-2, 417-3, . . . , and 417-m, respectively. The first output signal may represent a convolution of the first channel of the input data and the first kernel. The second output signal may represent a convolution of the second channel of the input data and the second kernel.

Figure 4B:
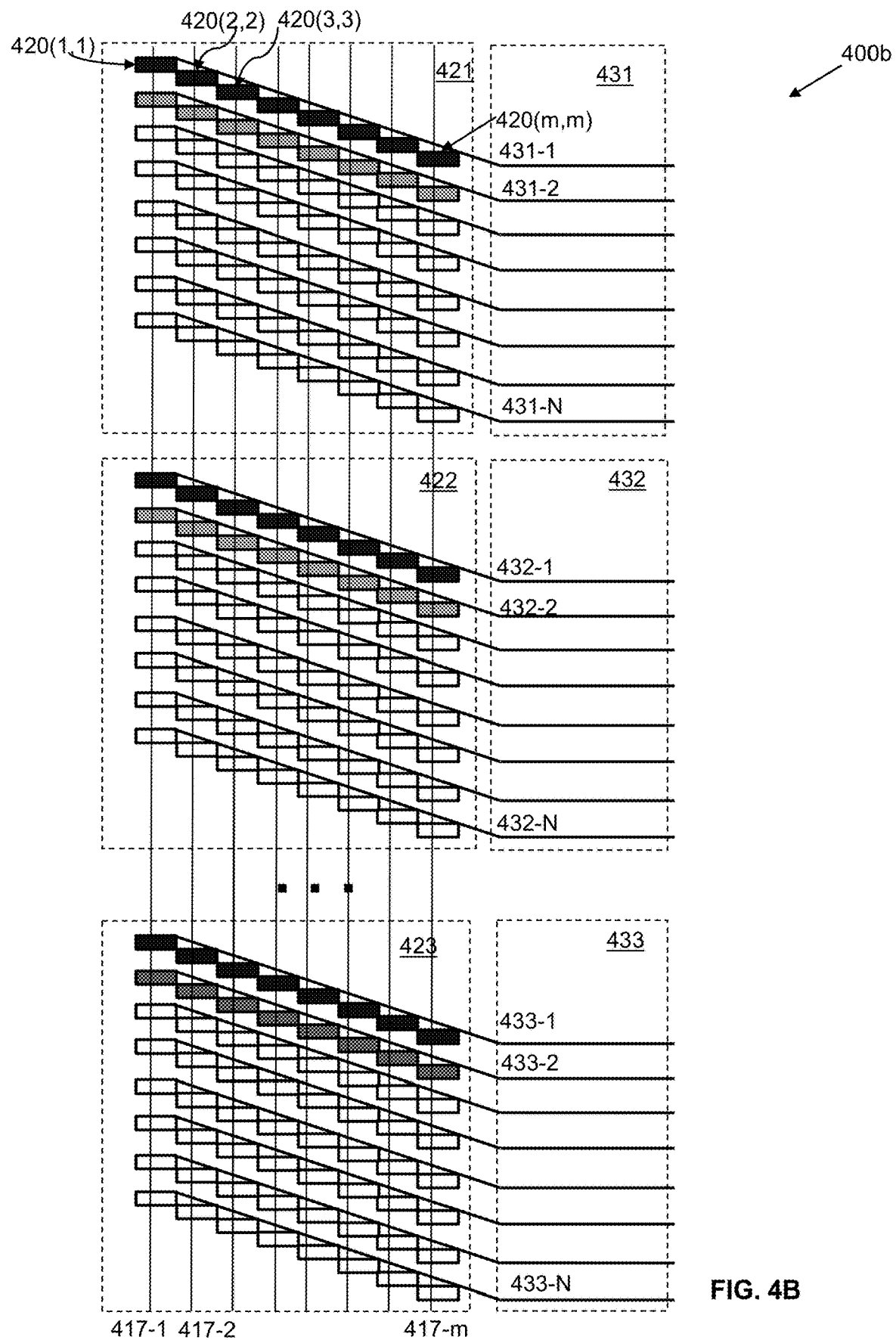

Referring to FIG. 4B, a crossbar circuit 400b may include a first group of select lines 431 connecting a first plurality of cross point devices 421, a second group of select lines 432 connecting a second plurality of cross-point devices 422, . . . , and the ith group of select lines 433 connecting the ith group of cross-point devices 423. Each of the select lines 431, 432, and 433 may be a select line 430 as described in connect with FIG. 4A. Each cross-point device in the plurality of cross-point devices 421, 422, and 423 may be a cross-point device 420 as described in connection with FIG. 4A. Each of the groups of select lines may include a certain number of select lines. Different groups of select lines (e.g., groups of select lines 431 and 432) may or may not have the same number of select lines.

The crossbar circuit 400*b* may be configured to perform multiple depth-wise convolution operations in parallel using multiple kernels and to perform depth-wise convolution operations using multiple groups of kernels sequentially. For example, the first element of each of a first plurality of kernels may be mapped to the cross-point devices connected to the select line 431-1. The second element of each of the first plurality of kernels may be mapped to the cross-point devices connected to the select line 432-1. The ith element of the first plurality of kernels may be mapped to the cross-point devices connected to the select line 433-1. The first element, the second element, . . . , and the ith element of each of a second plurality of kernels may be mapped to the cross-point devices connected to the select lines 431-2, 432-2, . . . , and 433-2, respectively. The first element, the second element, . . . , and the ith element of the nth plurality of kernels may be mapped to the cross-point devices connected to the select lines 431-N, 432-N, . . . , and 433-N, respectively. Each kernel of the first plurality of kernels, the second plurality of kernels, and the third plurality of kernels may be a depth-wise convolution kernel to be used to perform a depth-wise convolution operation.

To perform depth-wise convolution operations using the first plurality of kernels, the first select line of each of the groups of select lines (e.g., select lines 431-1, 432-1, . . . , 433-1) may be selected while the other select lines are not selected. For example, a suitable select voltage may be applied to the first select line of each of the groups of select lines. The cross-point devices connected to the first select line of the groups of select lines may thus be enabled. First input signals representative of first input data to be convolved using the first plurality of kernels may be applied to the enabled cross-point devices via word lines connected to the enabled cross-point devices (not shown).

As another example, to perform depth-wise convolution operations using the second plurality of kernels, the second select line of each of the groups of select lines may be selected (e.g., select lines 431-2, 432-2, . . . , 433-2). The cross-point devices connected to select lines 431-2, 432-2, . . . , 433-2 may thus be enabled. Second input signals representative of second input data to be convolved using the second plurality of kernels may be applied to the enabled cross-point devices via word lines connected to the enabled cross-point devices (not shown).

Figure 4C:
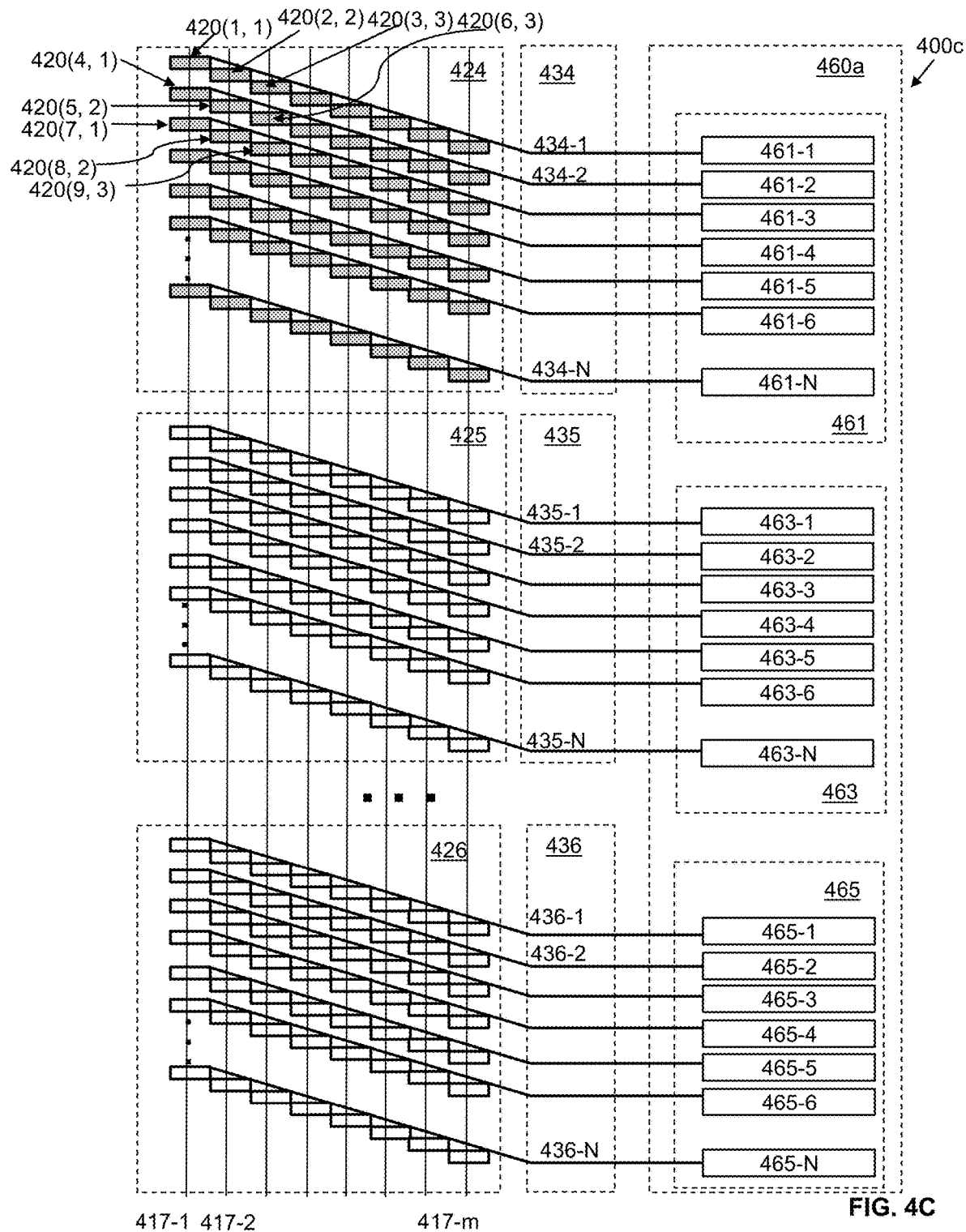

FIG. 4C illustrates an example 400*c* of a crossbar circuit in accordance with some embodiments of the present disclosure.

As shown, the crossbar circuit 400*c* may include groups of cross-point devices 424, 425, . . . , 426 and a selection logic 460*a*. The groups of cross-point devices 424, 425, . . . , 426 may be connected to the selection logic 460*a* via selection lines 434, 435, and 436, respectively. Each of the select lines 434, 435, and 436 may be and/or include a select line 430 of FIG. 4A. Each cross-point device of the groups 424, 425, . . . , 426 may include a plurality of cross-point devices 420 as described in connection with FIG. 4A above. The cross-point devices in the crossbar array 424 may be connected to a first portion 461 of the selection logic 460*a* via select lines 434. The cross-point devices in the crossbar array 425 may be connected to a second portion 463 of the selection logic 460*a* via select lines 435. The cross-point devices in the crossbar array 426 may be connected to a third portion 465 of the selection logic 460*a* via select lines 436. The selection logic 460*a* may include selection registers 461-1, 461-2, 461-3, 461-4, 461-5, 461-6, . . . , 461-N, 463-1, 463-2, 463-3, 463-4, 463-5, 463-6, . . . , 463-N, 465-1, 465-2, 465-3, 465-4, 465-5, 465-6, . . . , and 465-N. As shown, each of the select lines 434, 435, and 436 may be connected to a respective selection register of the selection logic 460*a*. The cross-point devices that are connected to the same select line may be enabled and used at the same time for performing convolution operations. Each of the select lines 434, 435, and 436 may be connected to a certain number of cross-point devices. The number of the cross-point devices connected to one select line of the crossbar circuit 400*c* may correspond to the number of the convolution operations that the crossbar circuit 400*c* may perform in parallel.

Depth-wise convolution kernels may be mapped to one or more of the cross-point devices of the crossbar circuit 400*c* for performing depth-wise convolution operations. For example, the first plurality of kernels, the second plurality of kernels, and the third plurality of kernels as described in connection with FIG. 4B may be mapped to cross-point devices 424, 425, and 426, respectively. To perform depth-wise convolution operations using the first plurality of kernels, the crossbar circuit 400*c* may enable the cross-point devices 424 via the select lines 434. First input signals representative of first input data to be convolved using the first plurality of kernels may be applied to the enabled cross-point devices 424. Each of the input signals may be a voltage signal representative of a portion of the first input data. The outputs produced via the bit lines 417-1, 417-2, . . . , **417-*m*** may represent the convolution results of the first input data and the first plurality of kernels.

To perform depth-wise convolution operations using the second plurality of kernels, the crossbar circuit 400*c* may enable the cross-point devices 425 via the select lines 435. Second input signals representative of second input data to be convolved using the second plurality of kernels may be applied to the enabled cross-point devices 425. Each of the second input signals may be a voltage signal representative of a portion of the second input data. The outputs produced via the bit lines 417-1, 417-2, . . . , **417-*m*** may represent the convolution results of the second input data and the second plurality of kernels.

Crossbar circuit 400*c* may perform depth-wise convolution operations using kernels of any suitable size. As an example, each of the groups of cross-point devices 424, 425, 426 may store eight kernels and may convolve input data using the eight kernels in parallel by means of 8 different channels. The crossbar circuit 400*c* may perform depth-wise convolution operations on input data of three channels. Three depth-wise convolution kernels may be mapped to the crossbar circuit 400*c* to convolve a first channel of the input data, a second channel of the input data, and a third channel of the input data, respectively. The size of the depth-wise convolution kernels (e.g., defined by a width dimension and a height dimension) may be the same. As an example, each of the first kernel, the second kernel, and the third kernel may be a 3×3 kernel having a width of 3 and a height of 3.

In some embodiments, the crossbar circuit 400*c* may perform depth-wise convolution operations on input data using 3×3 depth-wise kernels having a width of 3 and a height of 3. For example, the crossbar circuit 400*c* may store a first 3×3 kernel, a second 3×3 kernel, and a 3×3 third kernel by setting the conductance of the cross-point devices of the crossbar circuit 400*c* to values representative of elements of the kernels. For example, a first element of the first kernel, a first element of the second kernel, and a first element of the third kernel may be mapped to cross-point device 420(1, 1), 420(2, 2), and 420(3, 3), respectively. The first element of the first kernel, the first element of the second kernel, and the first element of the third kernel may be defined by a first width value (e.g., w0) and a first height value (e.g., h0). A second element of the first kernel, a second element of the second kernel, and a second element of the third kernel may be mapped to cross-point devices 420(4, 1), 420(5, 2), and 420(6, 3), respectively. The second element of the first kernel, the second element of the second kernel, and the second element of the third kernel may be defined by the first width value (e.g., w0) and a second height value (e.g., h1). A third element of the first kernel may be mapped to cross-point device 420(7, 1). A third element of the second kernel may be mapped to cross-point device 420(8, 2). A third element of the third kernel may be mapped to cross-point device 420(9, 3). The third element of the first kernel, the third element of the second kernel, and the third element of the third kernel may be defined by the first width (e.g., w0) and a third height (e.g., h2).

The remaining elements of the first kernel, the second kernel, and the third kernel may be mapped to the crossbar circuit 400c in a similar manner. For example, the ith element of the first kernel, the ith element of the second kernel, and the ith element of the third kernel may be mapped to three cross-point devices connected by the ith select line. A ninth element of the first kernel (w2h2c0) may be mapped to cross-point device 420(27, 1) (not shown). A ninth element of the second kernel (w2h2c1) may be mapped to cross-point device 420(28, 2) (not shown). A ninth element of a third kernel (w2h2c2) may be mapped to cross-point device 420(29, 3) (not shown).

To perform the depth-wise convolution operation, a plurality of input signals may be applied to a plurality of word lines (not shown). Each of the word lines may be connected to an enabled cross-point device. For example, a first input signal, a third input signal, a fourth signal, . . . , and a ninth input signal may be applied to the first word line, the second word line, the third word line, the fourth word line, . . . , the ninth word line of the crossbar circuit, respectively. The first input signal may represent a first element of a first channel of the image defined by the first width (w0) and the first height (h0). The second input signal may represent a first element of a second channel of the image defined by the first width and the first height. The third input signal may represent a first element of the third channel of the image defined by the first width and the first height. In some embodiments, the first input signal, the second input signal, . . . , the ninth input signal may represent the data items stored in continuous addresses 711, 712, 713, 714, 715, 716, 717, 718, and 719 as illustrated in FIG. 7, respectively.

As the first kernel is mapped to cross-point devices connected to the first bit line, the cumulative current outputted via the first bit line 417-1 may represent a convolution of the first channel of the input data and the first kernel. Similarly, the cumulative current outputted via the second bit line 417-2 may represent a convolution of the second channel of the input data and the second kernel. The cumulative current outputted via the third bit line may represent a convolution of the first channel of the image and the third kernel.

Figure 4D:
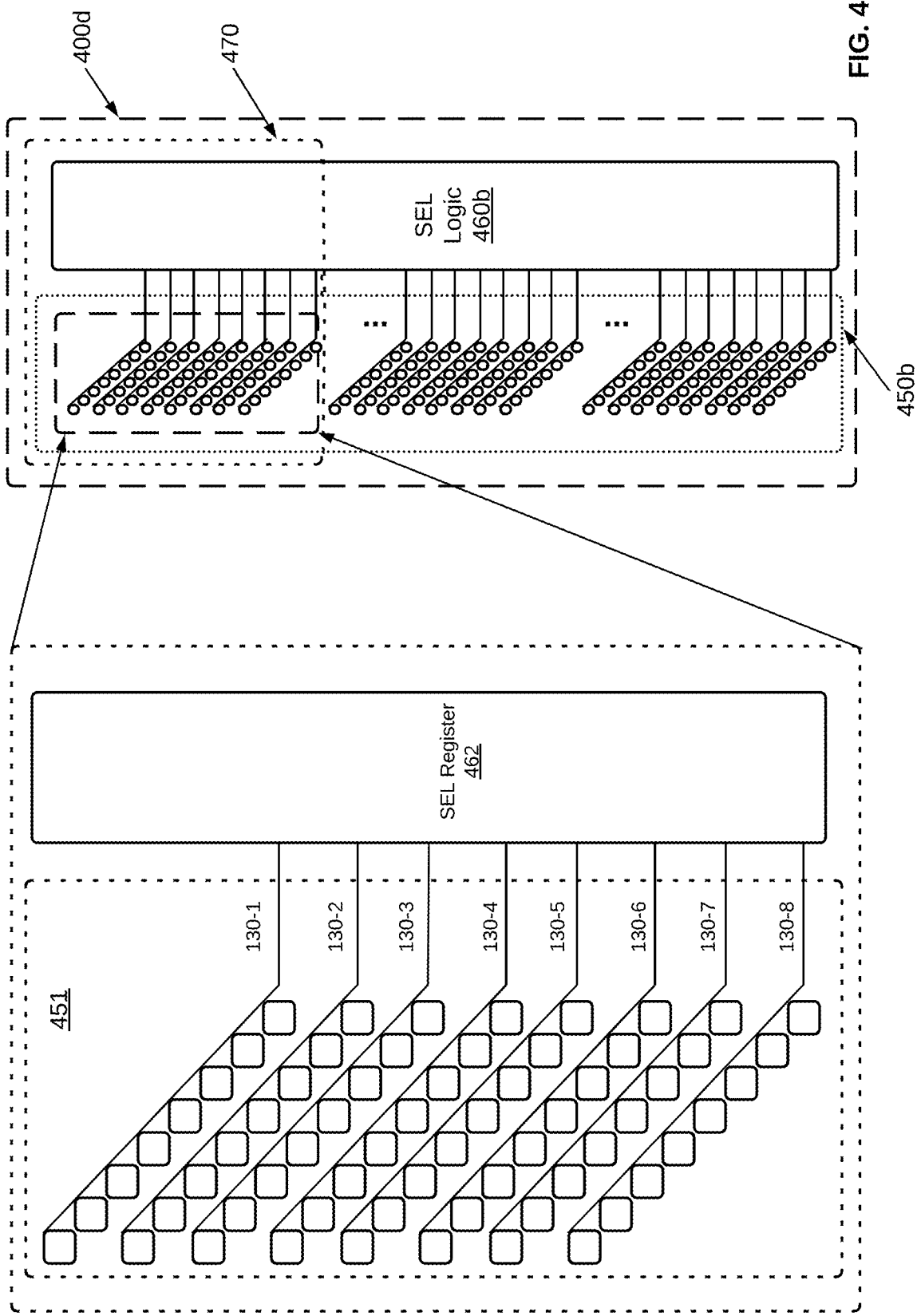
Figure 4E:
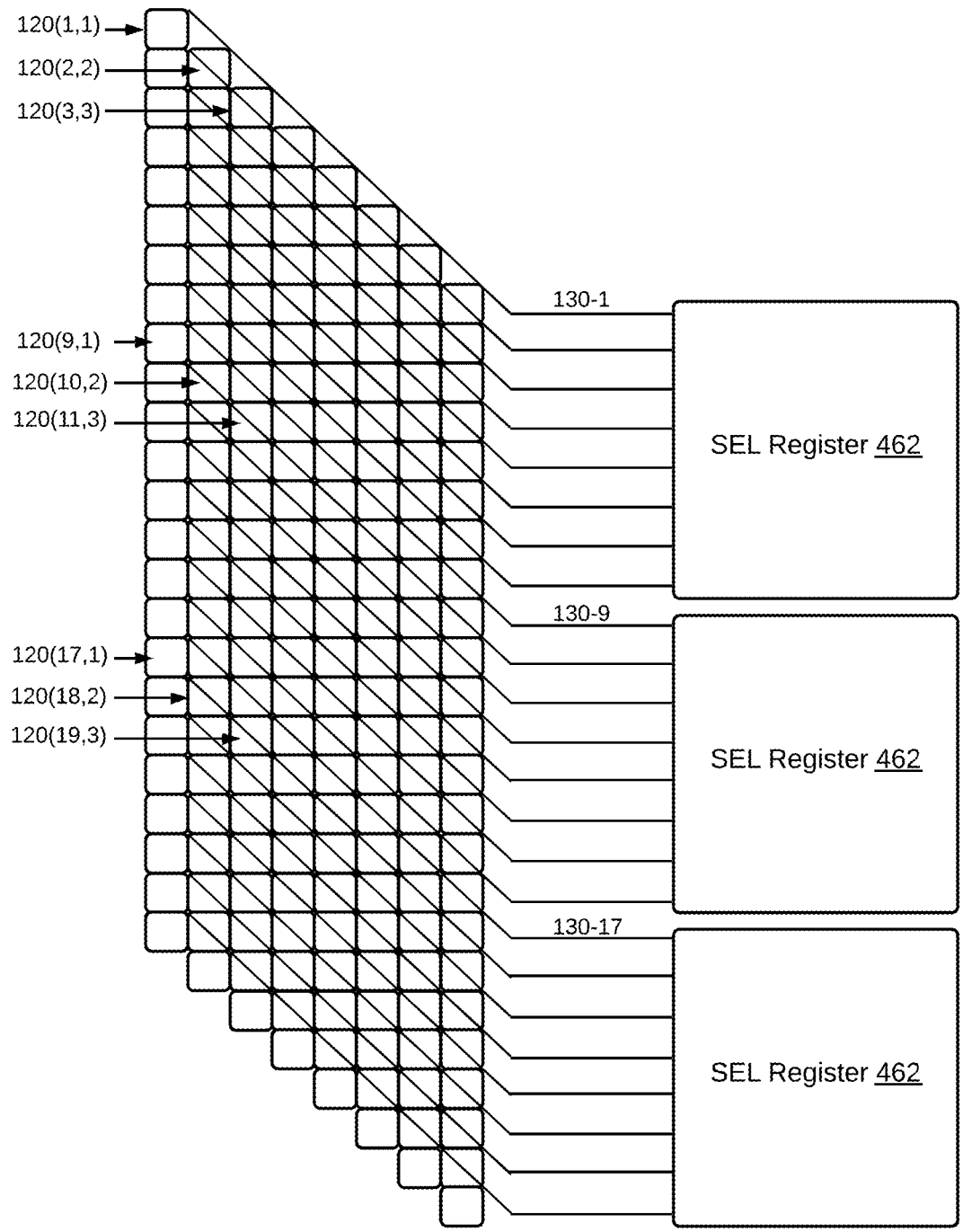

FIGS. 4D and 4E illustrate an example kernel mapping scheme for performing depth-wise convolution by a crossbar circuit 400d in accordance with some embodiments of the present disclosure.

As shown, the crossbar circuit 400d may include crossbar arrays 450b and a selection logic 460b. The crossbar arrays may include one or more crossbar arrays 300 as described in connection with FIG. 3 above. The select lines 130-1, 130-2, 130-3, . . . , 130-8 may be connected to a selection register 462 and may be enabled at the same time. In some embodiments, the crossbar circuit 400d may include nine or more crossbar arrays. The crossbar circuit 400d may thus include 72 select lines. The 72 select lines may be divided into 9 groups. Each of the groups of select lines may include 8 select lines. The select lines in the same group may be connected to a shared selection register and may be selected at the same time. As such, the cross-point device connected by the same group of select lines may be enabled at the same time.

To perform depth-wise convolution on an image of three channels using 3×3 kernels as described above in connection with FIG. 4C, the crossbar circuit 400d may program the cross-point devices to store the kernels. The crossbar circuit 400c may store 64 sets of one-channel 3×3 kernel, and 8 of them can run at the same time by means of 8 different channels.

For example, as shown in FIG. 4E, the first element, the second element, and the third element of the first kernel may be mapped to cross-point devices 120(1, 1), 120(9, 1), and 120(17, 1), respectively. The first element, the second element, and the third element of the second kernel may be mapped to cross-point devices 120(2, 2), 120(10, 2), and 120(18, 2), respectively. first element, the second element, and the third element of the third kernel may be mapped to cross-point devices 120(3, 3), 120(11, 3), and 120(19, 3), respectively. The remaining elements of the first kernel, the second kernel, and the third kernel may be mapped to the crossbar circuit 430c in a similar manner. A ninth element of the first kernel (w2h2c0) may be mapped to cross-point device 120(65, 1) (not shown). A ninth element of the second kernel (w2h2c1) may be mapped to cross-point device 120(66, 2). A ninth element of the third kernel (w2h2c2) may be mapped to cross-point device 120(67, 3).

A data gap in the input buffer may be needed if the number of the channels of depth-wise convolution is less than eight. The number of gap may be the number of bit line (8) minus the number of channels.

Figure 5A:
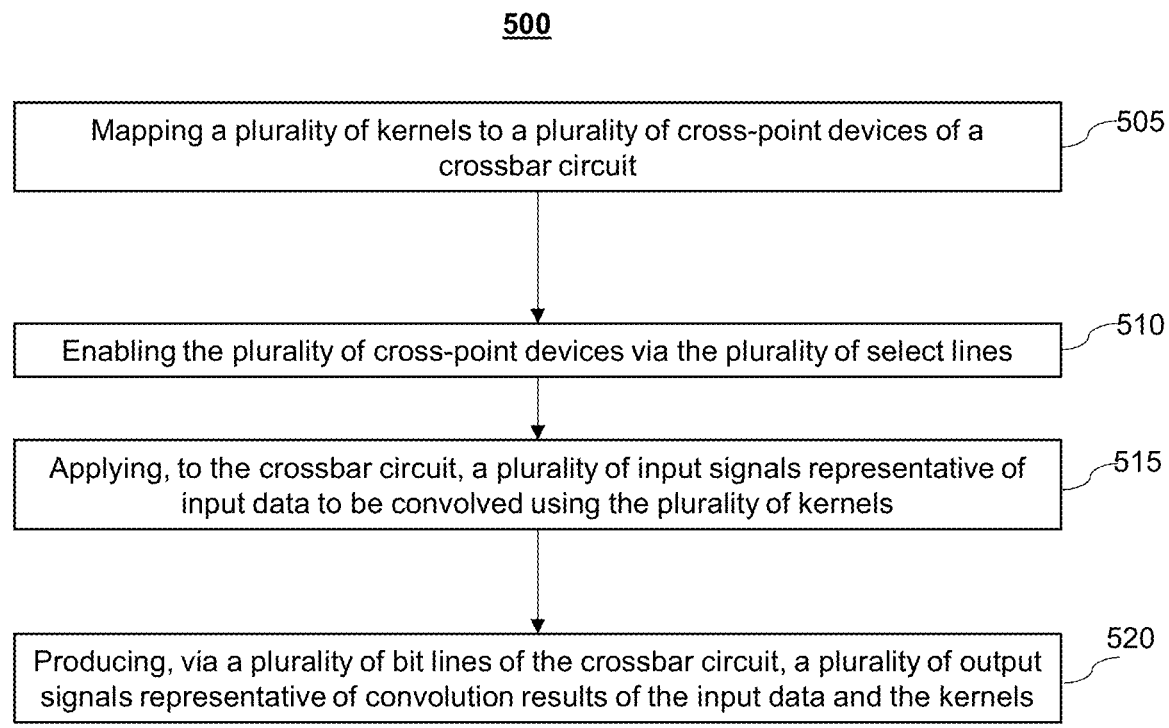
FIGS. 5A and 5B are flow diagrams illustrating example methods for performing depth-wise convolution using a crossbar circuit in accordance with some embodiments of the present disclosure.
Figure 5B:
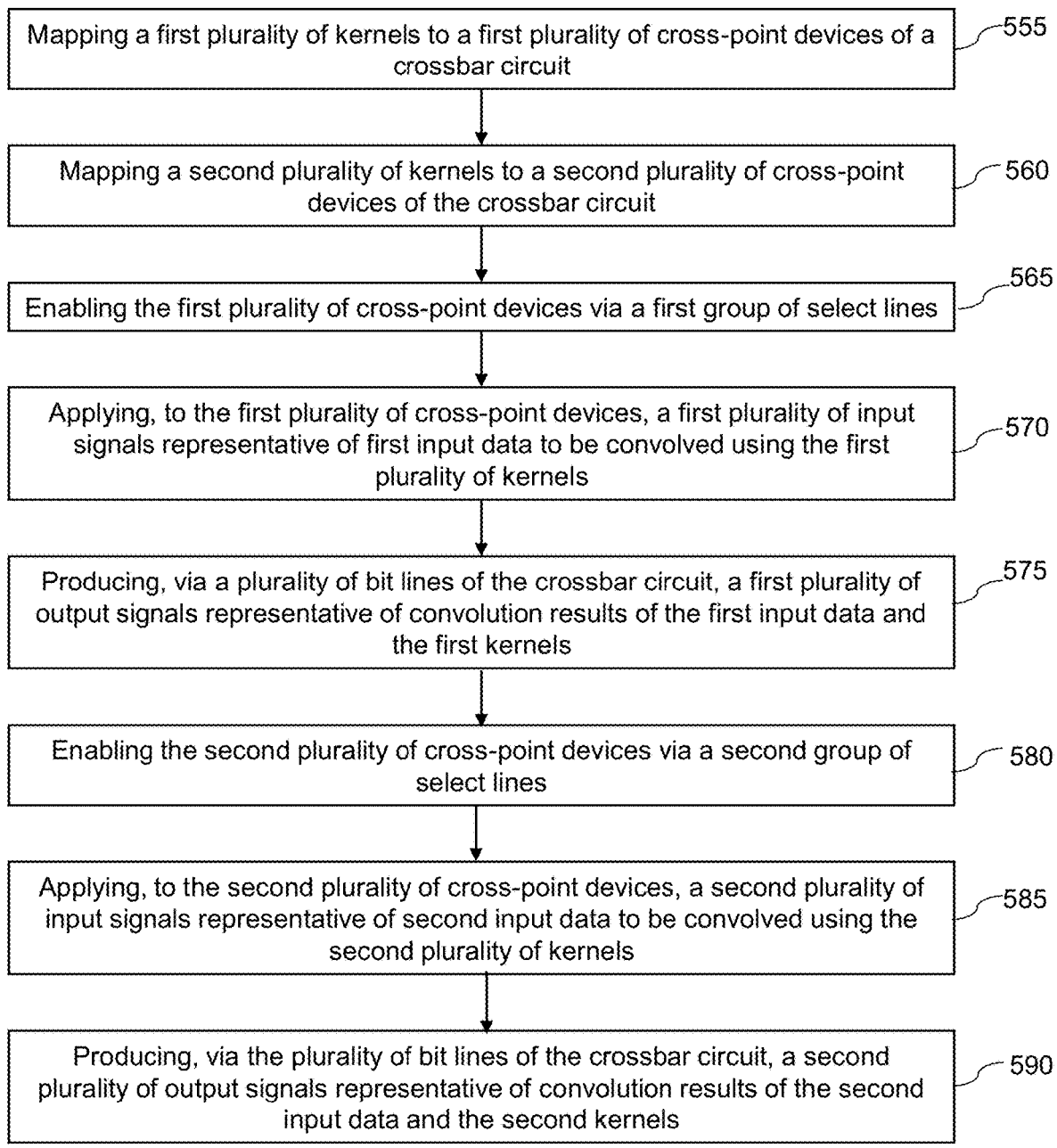

FIGS. 5A and 5B are flow diagrams illustrating example methods 500 and 550 for performing depth-wise convolution using a crossbar circuit according to some embodiments of the disclosure. The crossbar circuit may be and/or include the crossbar circuit 102, 300, 400a, 400b, 400c, and/or 400d.

Process 500 may begin at block 505, when a plurality of depth-wise convolution kernels may be mapped to a plurality of cross-point devices of a crossbar circuit. The cross-point devices may be connected to a plurality of select lines. Each of the select lines may connect cross-point devices that are connected to different word lines and different bit lines of the crossbar circuit. As an example, the cross-point devices may include the cross-point devices that are connected to select lines 430-1, 430-2, . . . , 430-i as described in connection with FIG. 4A. As another example, the cross-point devices may include the cross-point devices connected to select lines 431-1, 432-1, . . . , 433-1 as described in connection with FIG. 4B. As a further example, the cross-point devices may include the cross-point devices connected to select lines 434 as described in connection with FIG. 4C.

In some embodiments, the first element of each of the depth-wise convolution kernels may be mapped to a first group of cross-point devices connected to a first select line (e.g., the cross-point devices connected to the select line 430-1 of FIG. 4A, the cross-point devices connected to the select lines 431-1 of FIG. 4B). The second element of each of the depth-wise convolution kernels may be mapped to a second group of cross-point devices connected to a second select line (e.g., the cross-point devices connected to the select line 430-2 of FIG. 4A, the cross-point devices connected to the select line 432-1 of FIG. 4B, the cross-point devices connected to the select line 434-2 of FIG. 4C). The ith element of each of the depth-wise convolution kernels may be mapped to the ith group of cross-point devices connected to the ith select line (e.g., the cross-point devices connected to the select line 430-i of FIG. 4A, the cross-point devices connected to the select line 433-1 of FIG. 4B, the cross-point devices connected to the select line 434-N of FIG. 4C). Each of the kernels may be a k×k kernel in some embodiments.

The depth-wise convolution kernels may be mapped to the cross-point devices by programming conductance values of the cross-point devices to values that represent elements of the kernels. For example, a first element of a first kernel may be mapped to a first cross-point device by programming the first cross-point device to a first conductance value representative of the first element of the first kernel. The first cross-point device may connect a first bit line and a first word line of the crossbar circuit. As another example, a first element of a second kernel may be mapped to a second cross-point device by programming the second cross-point device to a second conductance value representative of the first element of the second kernel. The second cross-point device may connect a second bit line and a second word line of the crossbar circuit. The first element of the first kernel and the first element of the second kernel correspond to a first height value and a first width value. As still another example, a second element of the first kernel may be mapped to a third cross-point device by programming the third cross-point device to a third conductance value representative of the second element of the first kernel. The third cross-point device may connect the second word line and the first bit line. As a further example, a second element of the second kernel may be mapped to a fourth cross-point device by programming the fourth cross-point device to a fourth conductance value representative of the second element of the second kernel. The fourth cross-point device may connect a third word line and the second bit line of the crossbar circuit. The second element of the first kernel and the second element of the second kernel may correspond to a second height value and the first width value.

At block 510, the plurality of cross-point devices may be enabled via the plurality of select lines. For example, the first group of cross-point devices may be enabled via the first select line. The first group of cross-point devices may include the first cross-point device and the second cross-point device. As another example, the second group of cross-point devices may be enabled via the second select line. The second group of cross-point devices may include the third cross-point device and the fourth cross-point device. Enabling the cross-point devices may involve applying a suitable select voltage to each of the plurality of select lines in some embodiments.

At block 515, a plurality of input signals may be applied to the crossbar circuit. The input signals may be applied to the crossbar circuit via a plurality of word lines connected to the enabled cross-point devices (e.g., word lines 411, 413, and 415 as described in connection with FIG. 4A). The input signals may represent input data to be convolved using the kernels mapped to the crossbar circuit. For example, the plurality of input signals may include a first input signal representative of a first portion of a first channel of the input data and a second input signal representative of a second portion of a second channel of the input data. The first input signal and the second input signal may be applied to the crossbar circuit via the first word line and the second word line, respectively. In some embodiments, the input data may include one or more images.

At block 520, the crossbar circuit may produce a plurality of output signals representative of convolution results of the input data and the kernels via a plurality of bit lines of the crossbar circuit. The output signals may be, for example, output signals 417-1, 417-2, . . . , 417-m outputted via bit lines 407-1, 407-2, . . . , 407-m as described in connection with FIG. 4A. As an example, a first output signal (e.g., output signal 417-1 of FIG. 4A) representative of a first convolution of a first portion of the input data and a first kernel may be outputted via a first bit line. As another example, a second output signal (e.g., output signal 417-2 of FIG. 4A) representative of a second convolution of a second portion of the input data and a second kernel may be outputted via a second bit line. The first portion of the input data and the second portion of the input data may correspond to a first channel of the input data and a second channel of the input data, respectively.

Process 550 may begin at 555, when a first plurality of kernels may be mapped to a first plurality of cross-point devices of a crossbar circuit. The first plurality of cross-point devices may be connected to a first group of select lines. Each of the first group of select lines may connect multiple cross-point devices that do not share a bit line or a word line. As an example, the first plurality of kernels may be mapped to the cross-point devices connected to select lines 431-1, 432-1, . . . , and 433-1 as described in connection with FIG. 4B above. As another example, the first plurality of kernels may be mapped to the cross-point devices connected to select lines 434-1, 434-2, . . . , 434-N as described in connection with FIG. 4C above.

At 560, a second plurality of kernels may be mapped to a second plurality of cross-point devices of the crossbar circuit. The second plurality of cross-point devices may be connected to a second group of select lines. Each of the second group of select lines may connect multiple cross-point devices that do not share a bit line or a word line. As an example, the second plurality of kernels may be mapped to the cross-point devices connected to select lines 431-2, 432-2, . . . , and 433-2 as described in connection with FIG. 4B above. As another example, the first plurality of kernels may be mapped to the cross-point devices connected to select lines 435-1, 435-2, . . . , 435-N as described in connection with FIG. 4C above.

At 565, the first plurality of cross-point devices may be enabled via the first group of select lines. For example, a suitable select voltage may be applied to each of the first group of select lines. As a more particular example, the cross-point devices connected to the select lines 431-1, 432-1, . . . , 433-1 of FIG. 4B may be enabled. As another more particular example, the cross-point devices connected to the select lines 434-1, 434-2, . . . , 434-N may be enabled.

At 570, a first plurality of input signals may be provided to the first plurality of cross-point devices. Each of the first plurality of input signals may represent a portion of first input data to be convolved using the first plurality of kernels. The first plurality of input signals may be applied to the first plurality of cross-point devices via a first plurality of word lines. Each of the first plurality of word lines may be connected to a respective cross-point device of the first plurality of cross-point devices.

At 575, a first plurality output signals may be outputted via a plurality of bit lines of the crossbar circuit. The first output signal may represent convolution results of the first input data and the first plurality of kernels. The bit lines may be, for example, bit lines 413-1, 413-2, ..., 417-*m* as described in connection with FIGS. 4B and 4C above.

At 580, a second plurality of cross-point devices may be enabled via the second group of select lines. For example, a suitable select voltage may be applied to each of the second group of select lines. As a more particular example, the cross-point devices connected to the select lines 431-2, 432-2, ..., 433-2 of FIG. 4B may be enabled. As another more particular example, the cross-point devices connected to the select lines 435-1, 435-2, ..., 435-N may be enabled.

At 585, a second plurality of input signals may be provided to the second plurality of cross-point devices. The second plurality of input signals may represent second input data to be convolved using the second plurality of kernels. The second plurality of input signals may be applied to the second plurality of cross-point devices via a second plurality of word lines. Each of the second plurality of word lines may be connected to a respective cross-point device of the second plurality of cross-point devices.

At 590, a second plurality of output signals may be outputted via the plurality of bit lines of the crossbar circuit. The second output signal may represent convolution results of the second input data and the second plurality of kernels.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form.

Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A method, comprising:
   mapping a plurality of kernels to a plurality of cross-point devices of a crossbar circuit;
   enabling, via a plurality of select lines of the crossbar circuit, the plurality of cross-point devices;
   applying, to the plurality of cross-point devices, a plurality of input signals representative of input data to be convolved using the plurality of kernels; and
   outputting, via a plurality of bit lines of the crossbar circuit, a plurality of output signals representative of convolution results of the input data and the kernels,
   wherein the plurality of select lines comprises a first select line connecting a first group of the plurality of cross-point devices and a second select line connecting a second group of the plurality of cross-point devices, and wherein the first group of the plurality of cross-point devices comprises a first cross-point device connecting a first word line and a first bit line and a second cross-point device connecting a second word line and a second bit line, and wherein the second group of the plurality of cross-point devices comprises a third cross-point device connecting a third word line and the first bit line and a fourth cross-point device connecting a fourth word line and the second bit line.

2. The method of claim 1, wherein mapping the plurality of kernels to the plurality of cross-point devices of the crossbar circuit comprises:
   mapping a first element of a first kernel of the plurality of kernels to the first cross-point device; and
   mapping a first element of a second kernel of the plurality of kernels to the second cross-point device.

3. The method of claim 2, wherein mapping the plurality of kernels to the plurality of cross-point devices of the crossbar circuit further comprises:
   mapping a second element of the first kernel to the third cross-point device; and
   mapping a second element of the second kernel to the fourth cross-point device.

4. The method of claim 1, wherein enabling, via the plurality of select lines, the plurality of cross-point devices comprises applying a first select voltage to the first select line to enable the first group of the plurality of cross-point devices.

5. The method of claim 1, wherein enabling, via the plurality of select lines, the plurality of cross-point devices comprises applying a second select voltage to the second select line to enable the second group of the plurality of cross-point devices.

6. The method of claim 1, applying, to the plurality of cross-point devices, the plurality of input signals representative of the input data to be convolved using the plurality of kernels comprises:
  applying a first input signal to the first cross-point device via the first word line of the crossbar circuit; and
  applying a second input signal to the second cross-point device via the second word line of the crossbar circuit, wherein the first input signal represents a first portion of a first channel of the input data, and wherein the second input signal represents a second portion of a second channel of the input data.

7. The method of claim 6, further comprising:
  retrieving a first data item and a second data item stored in consecutive addresses, wherein the first input signal represents the first data item, and wherein the second input signal represents the second data item.

* * * * *